US010290516B2

(12) United States Patent
Yoneda et al.

(10) Patent No.: US 10,290,516 B2
(45) Date of Patent: May 14, 2019

(54) SUBSTRATE PROCESSING APPARATUS, MAINTENANCE METHOD, AND MAINTENANCE PROGRAM

(71) Applicant: Hitachi Kokusai Electric Inc., Tokyo (JP)

(72) Inventors: Akihiko Yoneda, Toyama (JP); Hiroshi Kotani, Toyama (JP); Yasuhiro Mizuguchi, Toyama (JP)

(73) Assignee: KOKUSAI ELECTRIC CORPOATION, Tokyo (JP)

( * ) Notice: Subject to any disclaimer, the term of this patent is extended or adjusted under 35 U.S.C. 154(b) by 491 days.

(21) Appl. No.: 13/847,209

(22) Filed: Mar. 19, 2013

(65) Prior Publication Data
US 2013/0253689 A1 Sep. 26, 2013

(30) Foreign Application Priority Data

Mar. 21, 2012 (JP) .................................. 2012-063424
Feb. 19, 2013 (JP) .................................. 2013-029656

(51) Int. Cl.
H01L 21/67 (2006.01)
C23C 16/00 (2006.01)

(52) U.S. Cl.
CPC .............. H01L 21/67 (2013.01); C23C 16/00 (2013.01)

(58) Field of Classification Search
None
See application file for complete search history.

(56) References Cited

U.S. PATENT DOCUMENTS

2002/0014311 A1* 2/2002 Tometsuka .......... C23C 16/4405
156/345.12
2002/0155705 A1* 10/2002 Shimizu ........... G05B 19/41865
438/662

(Continued)

FOREIGN PATENT DOCUMENTS

JP 2005-150259 A 6/2005
JP 3824835 B2 7/2006

(Continued)

OTHER PUBLICATIONS

Japanese Notification of Reasons for Refusal, JP Application No. 2013-029656, dated Jan. 27, 2017, 3 pages (English translation provided).

Primary Examiner — Robert E Fennema
Assistant Examiner — Marzia T Monty
(74) Attorney, Agent, or Firm — Volpe and Koenig, P.C.

(57) ABSTRACT

Provided is a substrate processing apparatus which may update an accumulated film thickness of each dummy substrate when a dummy substrate carrier is reloaded. The substrate processing apparatus includes: a process chamber where a plurality of substrates including a dummy substrate are processed; a substrate receiving unit whereon a dummy substrate carrier accommodating at least the dummy substrate is placed; a memory unit configured to store a film thickness of the dummy substrate in the dummy substrate carrier when the dummy substrate carrier is unloaded from the substrate receiving unit; and a management unit configured to update the film thickness of the dummy substrate in the dummy substrate carrier based on the film thickness stored in the memory unit when the dummy substrate carrier is reloaded onto the substrate receiving unit.

9 Claims, 11 Drawing Sheets

(56) References Cited

U.S. PATENT DOCUMENTS

| | | | |
|---|---|---|---|
| 2004/0110311 A1* | 6/2004 | Flanner | H01L 21/67276 438/10 |
| 2005/0124084 A1 | 6/2005 | Shimizu et al. | |
| 2006/0235558 A1* | 10/2006 | Tanaka | C12Q 1/26 700/108 |
| 2008/0182345 A1* | 7/2008 | Sugishita | H01L 22/20 438/7 |
| 2008/0299684 A1* | 12/2008 | Rothe | H01L 21/67294 438/14 |
| 2009/0228217 A1* | 9/2009 | Fukushima | G01N 21/956 702/35 |
| 2010/0042392 A1* | 2/2010 | Fukuda | C25D 21/12 703/6 |
| 2012/0052600 A1* | 3/2012 | Kamimura | G05B 19/41875 438/8 |
| 2013/0102159 A1* | 4/2013 | Kotani | H01L 21/67276 438/758 |

FOREIGN PATENT DOCUMENTS

| | | |
|---|---|---|
| JP | 4294972 B2 | 4/2009 |
| JP | 2011-049432 A | 3/2011 |
| KR | 10-2004-0100996 | 12/2004 |

\* cited by examiner

FIG. 3

WAFER INFORMATION

ACCUMULATED FILM THICKNESS

COUNT OF USAGE

| SOURCE | ACCUMULATED FILM THICKNESS (nm) | COUNT OF USAGE |
|---|---|---|
| 3-25 | 0.0 | 0 |
| 3-24 | 0.0 | 0 |
| 3-23 | 0.0 | 0 |
| 3-22 | 0.0 | 0 |
| 3-21 | 0.0 | 0 |
| 3-20 | 0.0 | 0 |
| 3-19 | 0.0 | 0 |
| 3-18 | 0.0 | 0 |
| 3-17 | 0.0 | 0 |
| 3-16 | 0.0 | 0 |
| 3-15 | 0.0 | 0 |
| 3-14 | 0.0 | 0 |
| 3-13 | 0.0 | 0 |
| 3-12 | 0.0 | 0 |
| 3-11 | 0.0 | 0 |
| 3-10 | 0.0 | 0 |
| 3-9 | 0.0 | 0 |
| 3-8 | 0.0 | 0 |
| 3-7 | 0.0 | 0 |
| 3-6 | 0.0 | 0 |
| 3-5 | 0.0 | 0 |
| 3-4 | 0.0 | 0 |
| 3-3 | 0.0 | 0 |
| 3-2 | 0.0 | 0 |
| 3-1 | 0.0 | 0 |

| MODULE INFORMATION | | | | |
|---|---|---|---|---|
| | TITLE OF ITEM | ITEM TO BE OBSERVED | MONITOR | ALERT | ALARM |
| 1: | bb | ACCUMULATED FILM THICKNESS ▸ | 0.000 μm | 0.000 | 0.000 |
| 2: | | ▸ | | | |

SUBSTRATE PROCESSING APPARATUS, MAINTENANCE METHOD, AND MAINTENANCE PROGRAM

CROSS-REFERENCE TO RELATED PATENT APPLICATION

This U.S. non-provisional patent application claims priority under 35 U.S.C. § 119 of Japanese Patent Application No. 2012-063424 filed on Mar. 21, 2012 and Japanese Patent Application No. 2013-029656 filed on Feb. 18, 2013 in the Japanese Patent Office, the entire contents of which are hereby incorporated by reference.

BACKGROUND OF THE INVENTION

1. Field of the Invention

The present invention relates to a substrate processing apparatus including a process chamber in which a plurality of substrates are collectively processed, a maintenance method of the substrate processing apparatus, and a recording medium.

2. Description of the Related Art

In general, when a dummy substrate is used in a substrate processing apparatus including a process chamber in which a plurality of substrates are collectively processed, a method of uniformizing processes in a process chamber by housing a dummy substrate carrier in which a plurality of dummy substrates are accommodated in a substrate processing apparatus, when a number of product substrates is less than an available number of substrates which may be processed in the process chamber, unloading a certain number of dummy substrates by which the number of the product substrates is less than the available number of substrates from the dummy substrate carrier, and filling an empty space with the dummy substrates is used. In this case, since the dummy substrates are repeatedly used, if a substrate process is film formation, an accumulation film is formed on each of the dummy substrates when the dummy substrate is used a plurality of times.

Accordingly, when a dummy substrate is used, a thickness of an accumulation film of each dummy substrate has been conventionally managed and a dummy substrate carrier has been conventionally exchanged based on the thickness of the accumulation film. For example, Patent Reference 1 discloses an apparatus in which a dummy substrate to be used next is selected according to both a thickness of an accumulation film and a condition for exchanging a dummy substrate carrier related to the thickness of the accumulation film. In addition, Patent Reference 1 discloses that a cassette identifier, a number of dummy substrates held in the cassette, and map information of the dummy substrates in the cassette are previously stored, and when a dummy substrate carrier is exchanged and a new dummy substrate carrier is supplied to the apparatus, a counter of a thickness of an accumulation film of each dummy substrate is cleared to zero. As such, since the apparatus is a vertical apparatus and a dummy substrate is exchanged when a dummy substrate carrier is exchanged, a thickness of an accumulation film of each dummy substrate is updated. Even in a single-type apparatus, a thickness of an accumulation film is managed in the same manner, and when the thickness of the accumulation film reaches a limit value, an alarm signal is output so that a next process is not performed unless a dummy substrate carrier is exchanged. Once the dummy substrate carrier is exchanged, the thickness of the accumulation film is set to be cleared to zero.

CITED REFERENCE

1. Japanese Patent Registration No. 4294972

SUMMARY OF THE INVENTION

However, when a dummy substrate carrier is unloaded from a substrate processing apparatus and a thickness of an accumulation film of each dummy substrate is cleared to zero, defects may occur. In a single-type apparatus, when a thickness of an accumulation film does not reach a limit value but a maintenance operation or a recovery operation due to an abrupt abnormality is performed, a dummy substrate carrier may be unloaded. In this case, there may be a difference between a thickness of an accumulation film actually formed on a dummy substrate and a thickness of an accumulation film recognized by an apparatus controller, thereby making it impossible to accurately manage a thickness of an accumulation film. In a conventional art, after a maintenance operation or a recovery operation ends and a dummy substrate carrier is reloaded, a thickness of an accumulation film which is already written on a notebook or the like has to be newly input.

The objectives of the present invention are to provide a substrate processing apparatus which may update a thickness of an accumulation film of each dummy substrate when a dummy substrate carrier is reloaded, a maintenance method, and a maintenance program.

According to one embodiment of the present invention, there is provided a substrate processing apparatus including: a process chamber where a plurality of substrates including a dummy substrate are processed; a substrate receiving unit whereon a dummy substrate carrier accommodating at least the dummy substrate is placed; a memory unit configured to store a film thickness of the dummy substrate in the dummy substrate carrier when the dummy substrate carrier is unloaded from the substrate receiving unit; and a management unit configured to update the film thickness of the dummy substrate in the dummy substrate carrier based on the film thickness stored in the memory unit when the dummy substrate carrier is reloaded onto the substrate receiving unit.

According to another embodiment of the present invention, there is provided a maintenance method, the method including: (a) storing in a memory unit an accumulated film thickness representing a thickness of an film accumulated on a dummy substrate accommodated in a dummy substrate carrier when the dummy substrate carrier is unloaded from a substrate receiving unit prior to a regular maintenance operation of the substrate processing apparatus; (b) updating a film thickness of the dummy substrate in the dummy substrate carrier based on the accumulated film thickness stored in the memory unit using a management unit when the dummy substrate carrier is reloaded onto the substrate receiving unit; and (c) performing a process using the dummy substrate according to the film thickness updated in the step (b) after the regular maintenance operation is performed.

According to still another embodiment of the present invention, there is provided a maintenance method used in a substrate processing apparatus including a process chamber in which a predetermined number of various substrates are collectively processed and a substrate receiving unit on which a dummy substrate carrier in which a dummy substrate that is a type of the various substrates is accommodated is placed, the maintenance method including: a process of loading the dummy substrate carrier in which the dummy substrate used by another apparatus is received onto the substrate receiving unit; a process of obtaining information about an accumulated film thickness of each dummy substrate accommodated in the dummy substrate carrier loaded onto the substrate receiving unit; a process of updating the film thickness of each dummy substrate in the dummy substrate carrier on the substrate receiving unit based on the information; and a process of performing a process using each dummy substrate in the dummy substrate carrier after the dummy substrate carrier is loaded onto the substrate receiving unit according to the updated film thickness.

According to yet another embodiment of the present invention, there is provided a substrate processing method performed in a substrate processing apparatus including: a process chamber wherein a product substrate and a dummy substrate are processed, a substrate receiving unit whereon one of a product substrate carrier accommodating the product substrate and a dummy substrate carrier accommodating the dummy substrate is placed, a memory unit configured to store a film thickness of the dummy substrate in the dummy substrate carrier when the dummy substrate carrier is unloaded from the substrate receiving unit, and a management unit configured to update the film thickness of the dummy substrate in the dummy substrate carrier based on the film thickness stored in the memory unit when the dummy substrate carrier is reloaded onto the substrate receiving unit, the method including: (a) unloading the dummy substrate carrier accommodating the dummy substrate from the substrate receiving unit; (b) storing an accumulated film thickness representing a thickness of a film accumulated on the dummy substrate accommodated in the dummy substrate carrier in the memory unit when the step (a) is performed; (c) placing on the substrate receiving unit the product substrate carrier accommodating the product substrate after the step (a) is performed; (d) performing in the process chamber a process on the product substrate unloaded from the product substrate carrier placed on the substrate receiving unit; (e) reloading the dummy substrate carrier onto the substrate receiving unit after the step (d) is performed; (f) updating a film thickness of the dummy substrate in the dummy substrate carrier based on the accumulated film thickness stored in the memory unit using the management unit after the step (e) is performed; and (g) performing a process using the dummy substrate according to the film thickness updated in the step (f).

According to yet another embodiment of the present invention, there is provided a program that causes a computer connected to a substrate processing apparatus including a process chamber wherein a plurality of substrates including a dummy substrate are simultaneously processed and a substrate receiving unit whereon a dummy substrate carrier accommodating the dummy substrate is placed to perform: (a) a step of storing in a memory unit a film thickness of the dummy substrate in the dummy substrate carrier when the dummy substrate carrier is unloaded from the substrate receiving unit; and (b) a step of updating the film thickness of the dummy substrate in the dummy substrate carrier based on the film thickness stored in the memory unit when the dummy substrate carrier is reloaded onto the substrate receiving unit.

BRIEF DESCRIPTION OF THE DRAWINGS

FIG. 3 is an explanatory diagram illustrating a specific example of information about a dummy substrate managed by the apparatus controller of the substrate processing apparatus according to the first embodiment of the present invention.

FIG. 4 is an explanatory diagram illustrating a specific example of maintenance information managed by a manipulation unit of the substrate processing apparatus according to the first embodiment of the present invention.

DETAILED DESCRIPTION OF THE PREFERRED EMBODIMENTS

<First Embodiment of the Present Invention>

Hereinafter, a first embodiment of the present invention will be described with reference to the accompanying drawings.

(1) Configuration of Substrate Processing Apparatus

A substrate processing apparatus according to the present embodiment performs a process on a substrate by executing a substrate processing process based on a recipe in which a process order and a process condition are defined, and is configured as a batch-type substrate processing apparatus that simultaneously processes a plurality of substrates.

Examples of a substrate to be processed may include a semiconductor wafer substrate (hereinafter, simply referred to as a 'product substrate') on which, for example, a semiconductor integrated circuit device (semiconductor device) is manufactured. In addition, the examples of the substrate to be processed include a dummy substrate disposed on an empty space when a number of product substrates is less than an available number of substrates which may be processed in a process chamber in order to uniformize processes in the process chamber.

Examples of such a process performed on a product substrate or a dummy substrate may include etching, ashing, and film formation, but film formation is particularly performed in the present embodiment. Typical examples of a film formation process include a film formation using a chemical reaction (chemical vapor deposition: CVD).

Figure 1:
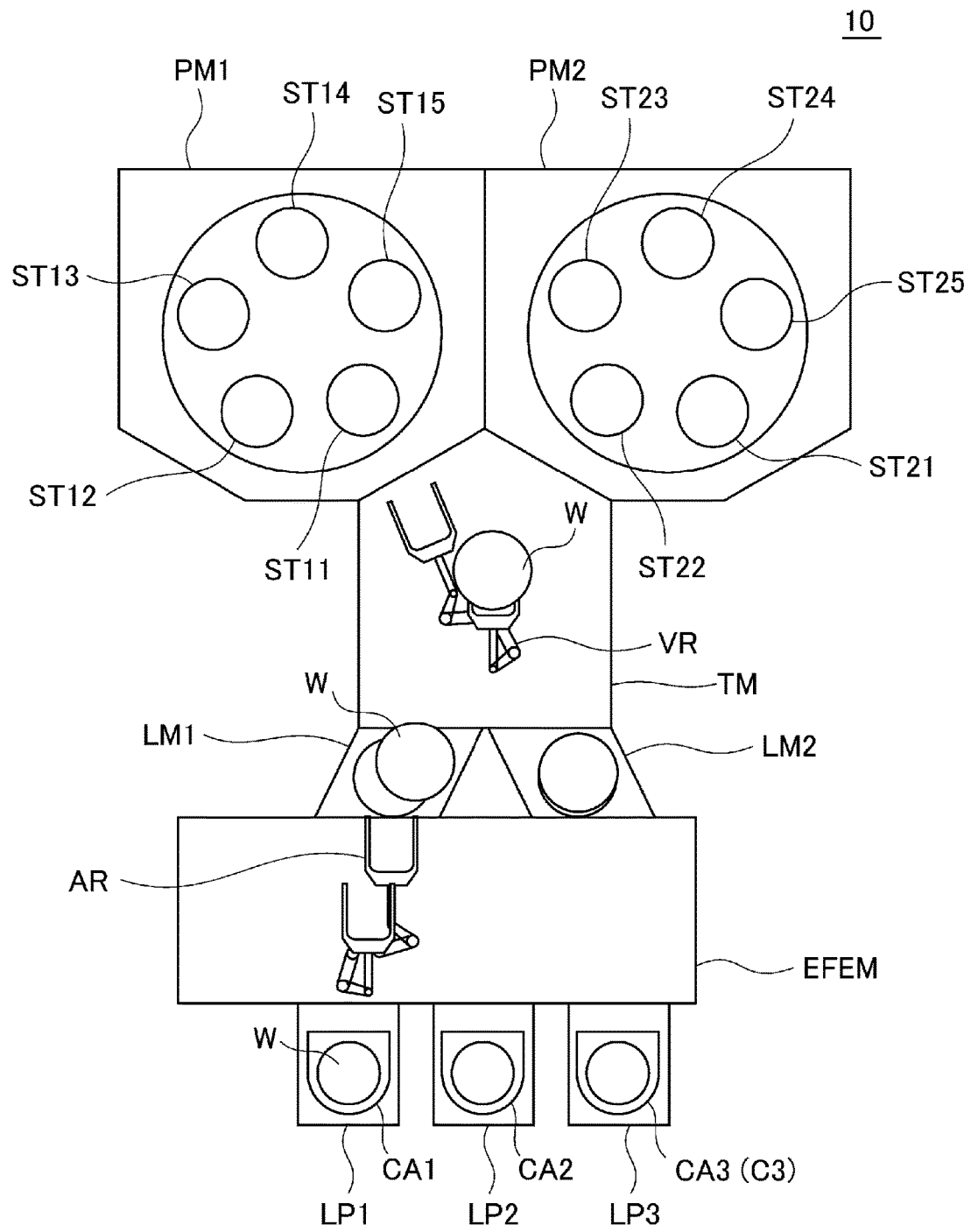
FIG. 1 is a schematic configuration diagram of a substrate processing apparatus according to a first embodiment of the present invention.

Hereinafter, a configuration of a substrate processing apparatus according to the present embodiment will be described with reference to FIG. 1. FIG. 1 is a schematic configuration diagram illustrating a substrate processing apparatus 10 which is a batch-type apparatus according to the present embodiment of the present invention.

The substrate processing apparatus 10 of FIG. 1 is divided into parts at a vacuum side and at an air side.

(Configuration at Vacuum Side)

At the vacuum side of the substrate processing apparatus 10, a vacuum transfer chamber (also referred to as a transfer module) TM that may be airtightly vacuumized, load-lock chambers (also referred to as a load-lock module) LM1 and LM2 which are used as preliminary chambers, and process chambers (also referred to as a process module) PM1 and PM2 which are used as a process chamber in which a plurality of substrates W are collectively processed are provided. The load-lock chambers LM1 and LM2 and the process chambers PM1 and PM2 are disposed to surround an outer circumference of the vacuum transfer chamber TM.

The vacuum transfer chamber TM is configured to endure a pressure (negative pressure) lower than atmospheric pressure such as a vacuum state. In addition, a housing of the vacuum transfer chamber TM of the present embodiment has a pentagonal shape when viewed from a plane, and has a box shape with both vertical ends closed thereof.

A vacuum robot VR is provided as a transfer unit in the vacuum transfer chamber TM. The vacuum robot VR mutually transfers a substrate W such as a product substrate or a dummy substrate formed of silicon (Si) or the like between the load-lock chambers LM1 and LM2 and the process chambers PM1 and PM2 by placing the substrate W on two arms which are substrate placing units. In addition, the vacuum robot VR is configured to be elevated while maintaining airtightness of the vacuum transfer chamber TM. In addition, the two arms may be horizontally stretched, and are configured to rotate on such a horizontal surface. In addition, a sensor for detecting presence of a substrate (not shown) is provided in the vacuum transfer chamber TM directly in front of each of the load-lock chambers LM1 and LM2 and the process chambers PM1 and PM2, and is configured to detect the presence of any of the substrates W on the arms.

The process chambers PM1 and PM2 respectively include substrate placing tables ST11 through ST15 and ST21 through ST25 on which the substrates W are placed, and are configured as batch-type process chambers in which, for example, the substrates W are simultaneously processed by 5 substrates. That is, each of the process chambers PM1 and PM2 functions as a process chamber in which a process such as CVD using a chemical reaction is performed on the substrate W. In addition, each of the process chambers PM1 and PM2 includes various elements, for example, a gas introduction/discharge mechanism and a temperature control/plasma discharge mechanism (both not shown), according to its function.

Also, each of the process chambers PM1 and PM2 communicates with the vacuum transfer chamber TM via a gate valve (not shown). Accordingly, the substrate W may be transferred between the vacuum transfer chambers TM by opening the gate valve. In addition, various substrate processes may be performed on the substrate W in a state in which a pressure or a processing gas atmosphere in the process chambers PM1 and PM 2 is maintained by closing the gate valve.

The load-lock chambers LM1 and LM2 function as preliminary chambers that load the substrate W into the vacuum transfer chamber TM or unload the substrate W from the vacuum transfer chamber TM. Buffer stages (not shown) which are used as substrate placing units that temporarily support the substrate W when the substrate W is loaded or unloaded are respectively provided in the load-lock chambers LM1 and LM2. The buffer stages may be configured as multi-step slots that hold a plurality of (for example, 2) substrates W.

Also, each of the load-lock chambers LM1 and LM2 communicates with the vacuum transfer chamber TM via a gate valve (not shown), and communicates with an air transfer chamber (also referred to as an equipment front end module) EFEM which will be described below via a gate valve (not shown). Accordingly, the substrate W may be transferred between the load-lock chambers LM1 and LM2 and the air transfer chamber EFEM in a state in which vacuum airtightness in the vacuum transfer chamber TM is maintained by opening the gate valve at the side of the air transfer chamber EFEM in a state in which the gate valve at the side of the vacuum transfer chamber TM is closed.

Also, the load-lock chambers LM1 and LM2 are configured to endure a negative pressure lower than atmospheric pressure such as a vacuum state, and insides of the load-lock chambers LM1 and LM2 may be vacuum-exhausted. Accordingly, by closing the gate valve at the side of the air transfer chamber EFEM, vacuum-exhausting the insides of the load-lock chambers LM1 and LM2, and then opening the gate valve at the side of the vacuum transfer chamber TM, the substrate W may be transferred between the load-lock chambers LM1 and LM2 and the vacuum transfer chamber TM in a state in which a vacuum state in the vacuum transfer chamber TM is maintained.

(Configuration at Air Side)

At the air side of the substrate processing apparatus 10, the air transfer chamber EFEM which is a front module connected to the load-lock chambers LM1 and LM2 as described above and loading ports LP1 through LP3 which are connected to the air transfer chamber EFEM and are used as substrate receiving units for placing carriers CA1 through CA3, which are used as substrate receiving units in which, for example, one lot of (e.g., 25) substrates W is accommodated, are provided.

For example, one air robot AR is provided as a transfer unit in the air transfer chamber EFEM. The air robot AR mutually transfers the substrate W between the load-lock chambers LM1 and LM2 and the loading ports LP1 through LP3. The air robot AR also includes 2 arms which are substrate placing units, like the vacuum robot VR. In addition, the sensor for detecting presence of a substrate (not shown) is provided in the air transfer chamber EFEM directly in front of each of the load-lock chambers LM1 and LM2, and is configured to detect the presence of the substrate W on the arms.

Also, an orientation flat alignment device (not shown) which aligns a crystal direction of the substrate W is provided as a substrate position correction device in the air transfer chamber EFEM. When the substrate W is a notch-type substrate, a notch-type alignment device may be provided as a substrate position correction device. In addition, a clean air unit (not shown) that supplies clean air into the air transfer chamber EFEM is provided in the air transfer chamber EFEM.

The loading ports LP1 through LP3 are configured to respectively place the carriers CA1 through CA3, which are used as substrate receiving units in which a plurality of substrates W are accommodated, on the loading ports LP1 through LP3. Slots (not shown), for example, one lot of (e.g., 25) slots, are formed as substrate receiving units in which the substrates W are accommodated in the carriers CA1 through CA3. The loading ports CA1 through CA3 are configured to read and store barcodes which are attached to the carriers CA1 through CA3 and indicate carrier IDs for identifying the carriers CA1 through CA3 when the carriers CA1 through CA3 are placed on the loading ports LP1 through LP3.

Also, a carrier C3 (hereinafter referred to as a 'dummy substrate carrier') which accommodates the substrate W which is a dummy substrate resides on one of the loading ports LP1 through LP3, for example, the loading port LP3. The substrate W which is a product substrate is accommodated in, for example, the carrier CA1 or the carrier CA2, is placed on the loading port LP1 or the loading port LP2, is transferred into the substrate processing apparatus 10, and is subjected to various processes. In addition, in order to improve substrate processing performance of the substrate processing apparatus 10, since a plurality of transfer spaces for the product substrate need to be secured with the multi-product small-lot trend, it is preferable for a number of the dummy substrate carrier C3 residing in the substrate processing apparatus 10 to be only 1.

Although the substrate processing apparatus 10 according to the present embodiment has been described, a number, a configuration, and a combination of chambers are not limited thereto and may be appropriately selected.

(2) Configuration of Apparatus Controller

The processing apparatus 10 configured as described above operates under the control of an apparatus controller 20. The apparatus controller 20 may be provided in the substrate processing apparatus 10, or may be separately provided from the substrate processing apparatus 10 and electrically connected to the substrate processing apparatus 10 via a communication line or the like.

Figure 2:
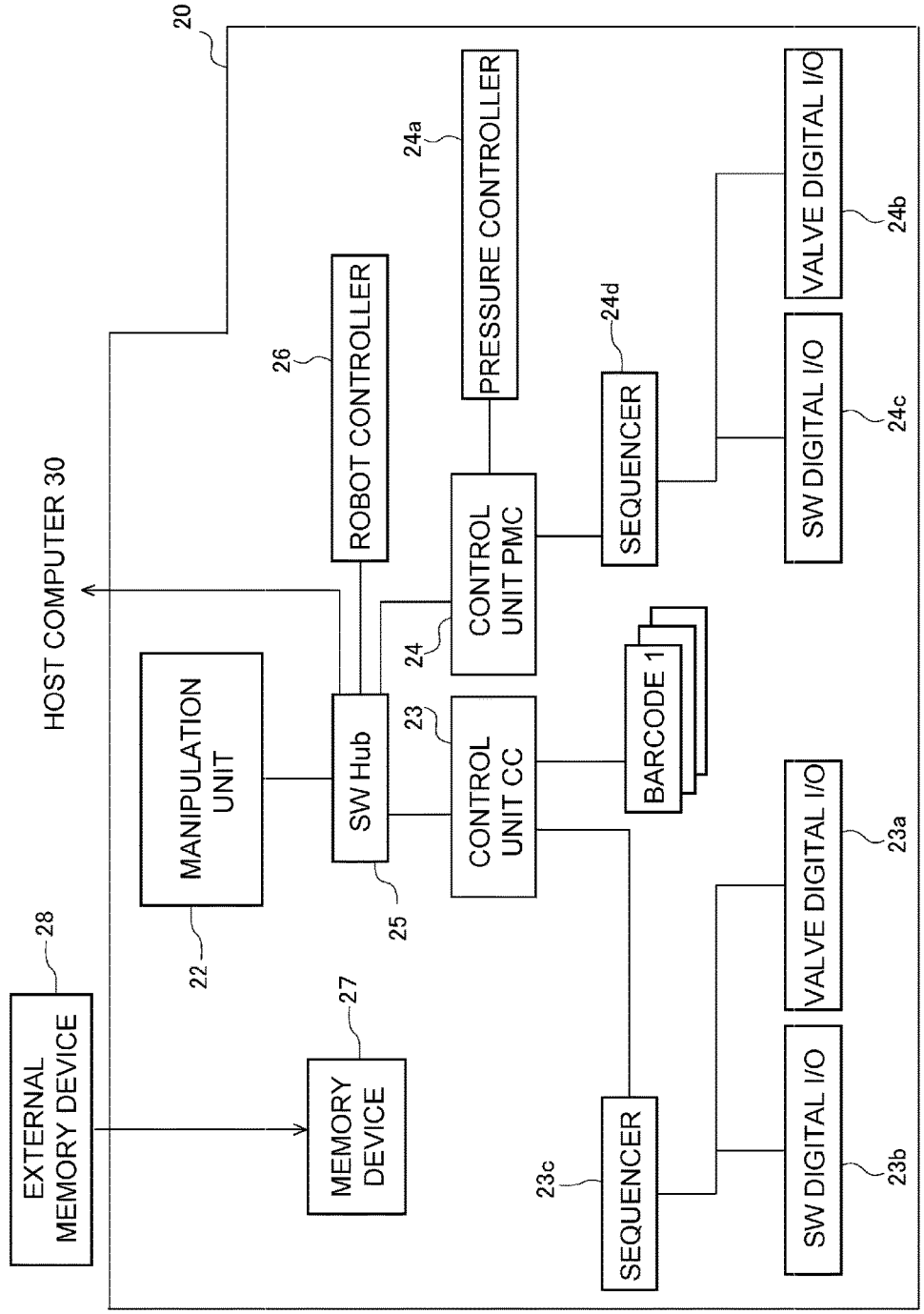
FIG. 2 is a block diagram illustrating an example of a schematic configuration of an apparatus controller of the substrate processing apparatus according to the first embodiment of the present invention.

Hereinafter, a configuration of the apparatus controller 20 according to the present embodiment will be described with reference to FIG. 2. FIG. 2 is a block diagram illustrating an example of a schematic configuration of the apparatus controller 20 of the substrate processing apparatus 10 according to the first embodiment of the present invention.

Referring to FIG. 2, the apparatus controller 20 roughly includes a manipulation unit 22, a control unit cluster controller 23 (hereinafter, 'cluster controller' is abbreviated to 'CC'), and a control unit process module controller 24 (hereinafter, 'process module controller' is abbreviated to 'PMC'). All of the manipulation unit 22, the control unit CC 23, and the control unit PMC 24 as described above are established to function as computers. In addition, the term 'computer' used herein refers to a unit that performs information processing instructed in each program by executing the program. Examples of the computer may include a central processing unit (CPU), a memory, an input/output device, and a combination thereof.

The manipulation unit 22, the control unit CC 23, and the control unit PMC 24 are connected to one another through a communication network such as a local area network (LAN) via a switching hub 25. In addition, a robot controller 26 that controls the air robot provided in the air transfer chamber EFEM and the vacuum robot VR provided in the vacuum transfer chamber TM is connected to the switching hub 25 in addition to the above-mentioned units.

The manipulation unit 22 includes an output device such as a display device and an input device such as a keyboard and a mouse, and is configured to output information about an operator and receive information input from the operator. In addition, the manipulation unit 22 has functions of instructing a system control command, displaying monitored content, storing logging data, analyzing an alarm, or editing a parameter by executing a predetermined program.

The control unit CC 23 has functions of controlling an operation of an overall system, controlling the vacuum robot VR, controlling the air robot AR, and controlling an exhaust system of the vacuum transfer chamber TM. The function of controlling the exhaust system of the vacuum transfer system TM includes controlling an operation of a mass flow controller MFC that controls a flow rate of a discharged gas, controlling an exhaust valve to be turned on/off, and controlling an operation of an exhaust pump. That is, the control unit CC 23 is configured to control the substrate W to be transferred in the substrate processing apparatus 10 by outputting control data (control indication) to the vacuum robot VR, the air robot AR, various valves, or switches when a product substrate or a dummy substrate is transferred based on a sequence recipe made or edited by the manipulation unit 22. Accordingly, a valve digital I/O 23a that controls the exhaust valve to be turned on/off and an SW digital I/O 23b that controls various switches SW to be turned on/off are connected to the control unit CC 23 via a sequencer 23c. In addition, in order to identify the carriers CA1 through CA3 and C3 placed on the loading ports LP1 through LP3, the control unit CC 23 also has a function of reading barcodes 1, 2, 3, . . . indicating carrier IDs of the carriers CA1 through CA3 and C3.

The control unit PMC 24 has a function of individually controlling the process chambers PM1 and PM2. That is, the control unit PMC 24 is configured to control a substrate to be processed in the process chambers PM1 and PM2 by outputting control data (control indication) to a pressure controller 24a, a processing gas supply/exhaust valve, various switches, an MFC, and a temperature regulator when a product substrate or a dummy substrate is processed based on a process recipe made or edited by the manipulation unit 22. Accordingly, the pressure controller 24a such as an auto-pressure controller APC that controls a pressure in the process chambers PM1 and PM2 is connected to the control unit PMC 24, and a valve digital I/O 24b that controls a processing gas to be supplied or an exhaust valve to be turned on/off and an SW digital I/O 24c that controls the various switches SW to be turned on/off are also connected to the control unit PMC 24 via a sequencer 24d.

Also, the apparatus controller 20 further includes a memory device 27 in addition to the manipulation unit 22, the control unit CC 23, and the control unit PMC 24. The memory device 27 is configured as a nonvolatile memory device such as a read-only memory (ROM) or a hard disk. The memory device 27 stores a control program for controlling an operation of the substrate processing apparatus 10, a recipe (to be described later) in which an order or a condition of a substrate process, etc. are defined so that the control program, the recipe, etc. may be read. In addition, the recipe is a combination for obtaining a predetermined result by causing the apparatus controller 20 to execute each process order in a substrate processing process which will be described below, and functions as a program. Hereinafter, the control program and the recipe are simply collectively referred to as a program. A 'dummy substrate accumulated film thickness management program' which will be described below in detail is included in various programs stored in the memory device 27.

Also, the apparatus controller 20 is not limited to that configured as a dedicated computer, and may be configured as a general-purpose computer. For example, the apparatus controller 20 of the present embodiment may be configured by preparing an external memory device (for example, a magnetic disk such as a magnetic tape, a flexible disk, or a hard disk, an optical disc such as a CD or a DVD, a magneto-optical disc such as an MO, or a semiconductor memory such as a USB memory or a memory card) which stores the above-mentioned program and installing the program in a general-purpose computer using the external memory device 28. In addition, a unit for providing a program to a computer is not limited to that providing a program via the external memory device 18. For example, a program may be provided without the external memory device 28 by using a communication unit such as the Internet or a dedicated line. In addition, the memory device 27 or the external memory device 28 is configured as a computer-readable recording medium. Hereinafter, the computer-readable recording medium is also simply referred to as a recording medium. In addition, examples of a case in which a term referred to as a recording medium is used in the description include a case in which only the memory device 27 is included, a case in which only the external memory device 28 is included, and a case in which both the memory device 27 and the external memory device 28 are included.

(3) Operation of Substrate Processing Apparatus

An operation of the substrate processing apparatus 10 according to the present embodiment will now be described with reference to FIG. 1. In the following description, operations of elements of the substrate processing apparatus 10 are controlled by the apparatus controller 20. A substrate processing process performed by the substrate processing apparatus 10 under the control of the apparatus controller 20 is performed as one process of a method of manufacturing a semiconductor apparatus.

(Loading of Substrate)

In a substrate processing process, first, insides of the vacuum transfer chamber TM and the processor chambers PM1 and PM2 are vacuum-exhausted in a standby and set to a vacuum transfer pressure state in advance. In addition, clean air is supplied into the air transfer chamber EFEM to have substantially atmospheric pressure in the air transfer chamber EFEM.

Next, for example, one of the carriers CA1 through CA3 and C3 in which a plurality of substrates W are accommodated is placed (loaded) on one of the loading ports LP1 through LP3, and which one of a product substrate and a dummy substrate is accommodated in the loaded carrier is determined based on a result obtained by reading a carrier ID.

When a command instruction indicating that a job should be implemented is received from a host computer 30 or the manipulation unit 22, the control unit CC 23 instructs the robot controller 26 that controls the air robot AR to load the substrate W into one of the load-lock chambers LM1 and LM2. When the substrate W is loaded into one of the load-lock chambers LM1 and LM2, an inside of one of the load-lock chamber LM1 and LM2 into which the substrate W is loaded from among the load-lock chambers LM1 and LM2 is vacuum-exhausted.

When the inside of one of the load-lock chambers LM1 and LM2 is depressurized to a predetermined pressure, the control unit CC 23 instructs the robot controller 26 that controls the vacuum robot VR to load the substrate W loaded into the load-lock chambers LM1 and LM2 into, for example, the process chamber PM1, through the vacuum transfer chamber TM. The loading of the substrate W into the process chamber PM1 is repeatedly performed until an available number of substrates W which may be processed in, for example, the process chamber PM1, are loaded and all of the substrate placing tables ST11 through ST15 in the process chamber PM1 are filled.

(Process in Process Chamber)

After a predetermined number of substrates W are transferred into the process chamber PM 1, a predetermined process, for example, film formation using plasma, is performed on the substrates W by supplying a processing gas into the process chamber PM1 or heating the substrates W. In this case, the same processing process or a different substrate process may be performed in the process chamber PM2 at the same time as the predetermined process is performed in the process chamber PM1.

In this case, when all of the substrate placing tables ST11 through ST15 are not filled and a substrate process is performed in a state in which a number does not reach a number of one batch of substrates, unnecessary film formation or etching may be performed on the substrate placing tables ST11 through ST15 onto which the substrates W are not loaded according to content of the substrate process. In particular, during a substrate process using plasma, electrical properties of the substrate placing tables ST11 through ST15 which are plasma electrodes may be changed or the performance of the substrate process may be accordingly changed, thereby deteriorating film formation characteristics or etching characteristics.

Accordingly, in the substrate processing apparatus 10 of the present embodiment, a substrate process is performed after all of the substrate processing tables ST11 through ST15 are filled with the product substrates. For example, even when all of the substrate placing tables ST11 through ST15 may not be filled with the product substrates, the product substrates and a dummy substrate are combined to form one batch. Accordingly, since the substrates W are placed on all of the substrate placing tables ST11 through ST15 and then a substrate process is performed, substrate process characteristics such as film formation characteristics or etching characteristics are stabilized.

When a process performed on the substrate W in the process chamber PM1 is completed, a status of the process chamber PM1 in the apparatus controller 20 is updated. In detail, a 'PM accumulated film thickness' which is an accumulated film thickness of an accumulation film formed in, for example, the process chamber PM1, is updated. In addition, a status of a dummy substrate is updated as will be described in detail below.

Also, such a process is similarly performed not only in the process chamber PM1 but also in the process chamber PM2.

(Unloading of Substrate)

When a necessary process is completed, the substrate W having been completely processed that is installed on the substrate placing tables ST11 through ST15 in, for example, the process chamber PM1 is unloaded in an order opposite to an order in which the substrate W is loaded as described above. Accordingly, a product substrate having been completely processed is unloaded on the carrier CA1 placed on, for example, the loading port LP1 and is received in an empty slot. In addition, a dummy substrate is unloaded on the dummy substrate carrier C3 placed on, for example, the loading port LP3, and is received in an empty slot. When all of the substrates W having been completely processed are accommodated in a predetermined carrier of the carriers CA1 and C3, in a state in which the dummy substrate carrier C3 in which the dummy substrate is accommodated resides on the loading port LP3, the carrier CA1 in which the product substrate having been completely processed is accommodated is unloaded from the loading port LP1, thereby completing the substrate processing process.

(4) Operation of Dummy Substrate

An operation of a dummy substrate in a series of process operations of the above-mentioned substrate processing process will be described in more detail.

(Use of Dummy Substrate)

A dummy substrate has two uses in the substrate processing apparatus 10 of the present embodiment.

In a first use, when a number of product substrates is less than an available number of substrates which may be collectively processed in the process chambers PM1 and PM2, a dummy substrate is used to compensate for the shortage. That is, assuming that product substrates are processed in the process chambers PM1 and PM2, when there is an empty space on the substrate placing tables ST11 through ST15 and ST21 through ST25, a dummy substrate is used to fill the empty space. As the empty space is filled with the dummy substrate as described above, unnecessary film formation performed on the empty space may be prevented, and processes in the process chambers PM1 and PM2 may be uniformized. When a process, particularly, a process using plasma, is performed, electrical properties of plasma electrodes may be changed due to an unnecessary process, a film formation state may be accordingly changed, and thus film formation characteristics may be deteriorated. However, the substrate processing apparatus 10 may effectively prevent these problems by filling the empty space with the dummy space.

In a second use, in order to suppress a product substrate from being processed on the substrate placing tables ST11 through ST15 and ST21 through ST25 which suffer from defects or problems, a dummy substrate is used. That is, a dummy substrate instead of a product substrate is loaded to and used for the substrate placing tables ST11 through ST15 and ST21 through ST25 which suffer from defects or problems. In detail, a heater tends to be considered for each substrate placing table and, in this case, characteristics vary according to substrate placing tables. However, such an adverse effect on a product substrate may be avoided by using a dummy substrate. In addition, when it may pass under a substrate placing table provided with a thermocouple lead line, characteristics of the substrate placing table may be changed. Even in this case, such an adverse effect on a product substrate may be avoided by using a dummy substrate. In addition, a number of product substrates which are loaded or substrate placing tables may be fixed under process conditions by using a dummy substrate.

As such, in order to make a number being an available number of dummy substrates which may be collectively processed in the process chambers PM1 and PM2 and in order to be loaded onto a substrate placing table having defects/problems, a dummy substrate is automatically placed and used on the substrate placing tables ST11 through ST15 and ST21 through ST25 under the control of the control unit CC 23. Accordingly, an operator who operates the manipulation unit 22 need only designate a product substrate on a lot start screen.

(Film Thickness Management of Dummy Substrate)

However, since a dummy substrate is repeatedly used, when a substrate process is, for example, film formation process, an accumulation film is formed while the dummy substrate is used a plurality of times. Accordingly, when a dummy substrate is overused, an accumulated film thickness may be increased, particles may be generated, and the dummy substrate may be bent or deformed due to a thermal history of repeated use or excessive film stress, thereby leading to a transfer error. Accordingly, the apparatus controller 20 manages an accumulated film thickness of the dummy substrate in the substrate processing apparatus 10 of the present embodiment.

The accumulated film thickness may be managed by storing information about the dummy substrate in at least one of the manipulation unit 22 and the control unit CC 23. FIG. 3 is an explanatory diagram illustrating a specific example of information about a dummy substrate.

Referring to FIG. 3, at least one of the manipulation unit 22 and the control unit CC 23 stores information about each dummy substrate accommodated in the dummy substrate carrier C3 using one lot (e.g., 25) of substrates as a unit. The information about the dummy substrate includes an accumulated film thickness of the dummy substrate. If necessary (for example, whenever a process is performed in the process chambers PM1 and PM2), the stored information is updated.

As such, at least one of the manipulation unit 22 and the control unit CC 23 manages information about a status of a dummy substrate, particularly, information including an accumulated film thickness of the dummy substrate. In addition, the managed information (particularly, the accumulated film thickness) is displayed and output to the operator from the manipulation unit 22 as monitored information about the dummy substrate.

Also, the accumulated film thickness of the dummy substrate is compared with a preset limit value, and it is determined whether the accumulated film thickness of the dummy substrate reaches the limit value, that is, whether the dummy substrate needs to be exchanged.

The limit value used in the determination is set as one of maintenance information managed by the manipulation unit 22. FIG. 4 is an explanatory diagram illustrating a specific example of maintenance information.

Referring to FIG. 4, in order to set a limit value, the manipulation unit 22 displays and outputs a management screen of maintenance information to the operator. When a 'dummy substrate accumulated film thickness' is selected on the management screen, the manipulation unit 22 enables a limit value to be input and set. The limit value to be input and set has two steps of values, that is, an alert limit value and an alarm (warning) limit value.

An accumulated film thickness maximum value from among a unit of dummy substrates whose accumulated film thicknesses are managed is monitored and displayed on the management screen of the maintenance information. After the alert limit value and the alarm limit value are set and input, the manipulation unit 22 monitors whether an accumulated film thickness being monitored and displayed reaches the alert limit value or the alarm limit value.

When the accumulated film thickness reaches the alert limit value, the manipulation unit 22 outputs an alert signal and reports the alert signal to the host computer 30 by displaying a background color of an accumulated film thickness display area with an alert color (for example, yellow) on, for example, a display screen, in order to accelerate the preparation of a dummy substrate carrier for exchange. In addition, when the accumulated film thickness reaches the alarm limit value, the manipulation unit 22 outputs an alarm signal and reports the alarm signal to the host computer 30 by displaying a background color of the accumulated film thickness display area with an alarm color (for example, red) on, for example, the display screen, in order to restrict the dummy substrate whose use exceeds its limit from being used. Next, although the manipulation unit 22 continuously operates until all jobs which are being executed are completed, the manipulation unit 22 does not allow a new job to be executed. After all the jobs are completed, the manipulation unit 22 provides a command instruction to the control unit CC 23 to automatically unload the dummy substrate carrier C3 from the loading port LP3.

When the dummy substrate carrier C3 is unloaded from the loading port LP3 according to an output of the alert signal or the alarm signal as described above, at least one of the manipulation unit 22 and the control unit CC 23 clears information about a status of the dummy substrate accommodated in the dummy substrate carrier C3, particularly, information including the accumulated film thickness of the dummy substrate, to zero in principle.

Next, the dummy substrate carrier C3 in which a new dummy substrate is accommodated is reloaded onto, for example, the loading port LP3, thereby continuously operating the dummy substrate.

(5) Reloading of Dummy Substrate Carrier

The dummy substrate carrier C3 is reloaded onto the loading port LP3 according to the output of an alert signal or an alarm signal as described above, and is reloaded according to first through fourth reloading types as will be described below.

(First Reloading Type) A regular maintenance operation needs to be performed on the substrate processing apparatus 10. Examples of the regular maintenance operation may include overhauling of the air transfer chamber EFEM which is a front module and greasing up of a transfer system such as the air robot AR in the air transfer chamber EFEM. Assuming that such a regular maintenance operation is performed, when the carriers CA1 through CA3 and C3 are placed on the loading ports LP1 through LP3 connected to the air transfer chamber EFEM, the carriers CA1 through CA3 and C3 may become obstructions. Accordingly, assuming that a regular maintenance operation is performed, when the dummy substrate carrier C3 is placed on, for example, the loading port LP3, even though an accumulated film thickness of a dummy substrate accommodated in the dummy substrate carrier C3 does not reach an alert limit value, the dummy substrate carrier C3 is first unloaded from the loading port LP3. After the regular maintenance operation ends, the dummy substrate carrier C3 is reloaded onto the loading port LP3.

(Second Reloading Type)

In a workplace in which a semiconductor apparatus using the substrate processing apparatus 10 is manufactured, there are cases in which the substrate processing apparatus 10 and another apparatus (for example, a vertical substrate processing apparatus or another substrate processing apparatus 10 under a regular maintenance operation) share a dummy substrate. In these cases, a dummy substrate which has been used by the other apparatus (which has already been used by the another apparatus but whose accumulated film thickness has not reached an alert limit value) is expected to be reused by the substrate processing apparatus 10. That is, the dummy substrate carrier C3 in which the reused dummy substrate is accommodated is loaded onto the loading port LP3. Hereinafter, loading in this case is also referred to as 'reloading.'

(Third Reloading Type)

There are cases in which a modifying work needs to be performed on the substrate processing apparatus 10. Examples of the modifying work may include updating of a version of software that operates the substrate processing apparatus 10. In addition, the examples of the modifying work include modifying (exchanging) of a constitute element of the substrate processing apparatus 10 in order to recover from an abrupt abnormality. Assuming that a modifying work is performed, although an operation after the modifying work is necessarily checked, the substrate processing apparatus 10 may unexpectedly operate while the operation is being checked. Accordingly, once the carriers CA1 through CA3 and C3 are placed on the loading ports LP1 through LP3, problems such as carrier damage or problems similar to the troubles may occur due to the unexpected operation. Accordingly, assuming that a modifying work is performed on the substrate processing apparatus 10, when the dummy substrate carrier C3 is placed on, for example, the loading port LP3, the dummy substrate carrier C3 is first unloaded from the loading port LP3 even though an accumulated film thickness of a dummy substrates which is accommodated does not reach an alert limit value. After the modifying work is performed on the substrate processing apparatus 10 ends and an operation after the modifying work is completely checked, the dummy substrate carrier C3 is reloaded onto the loading port LP3.

(Fourth Reloading Type)

There are cases in which it is known that a number of product substrates accommodated in the carriers CA1 through CA3 on, for example, the loading ports LP1 through LP3, is a multiple of an available number of substrates (e.g., 5 substrates) which may be collectively processed in the process chambers PM1 and PM2 in the substrate processing apparatus 10 and a dummy substrate is not needed for a long time. In these cases, it is assumed that the dummy substrate carrier C3 is unloaded from the loading port LP3, the loading ports LP1 through LP3 are secured for the carriers CA1 through CA3 in which product substrates are accommodated as possible, and an efficient operation is attained. In the case of attaining the operation as described above, the dummy substrate carrier C3 is reloaded onto the loading port LP3 after a period of time for which the dummy substrate is not needed elapses.

(Problems During Reloading)

In the first through fourth reloading types used as examples in the foregoing, when information including an accumulated film thickness of a dummy substrate is cleared to zero when the dummy substrate carrier C3 is unloaded from the loading port LP3, a film thickness of an accumulation film actually formed on the dummy substrate in the dummy substrate carrier C3 which is reloaded is different from a film thickness recognized by the apparatus controller 20. Accordingly, when the dummy substrate carrier C3 is reloaded, the apparatus controller 20 of the substrate processing apparatus 10 of the present embodiment is configured to reset an accumulated film thickness of each dummy substrate when the dummy substrate carrier C3 is reloaded as will be described below.

(6) Functional Configuration of Apparatus Controller

Figure 5:
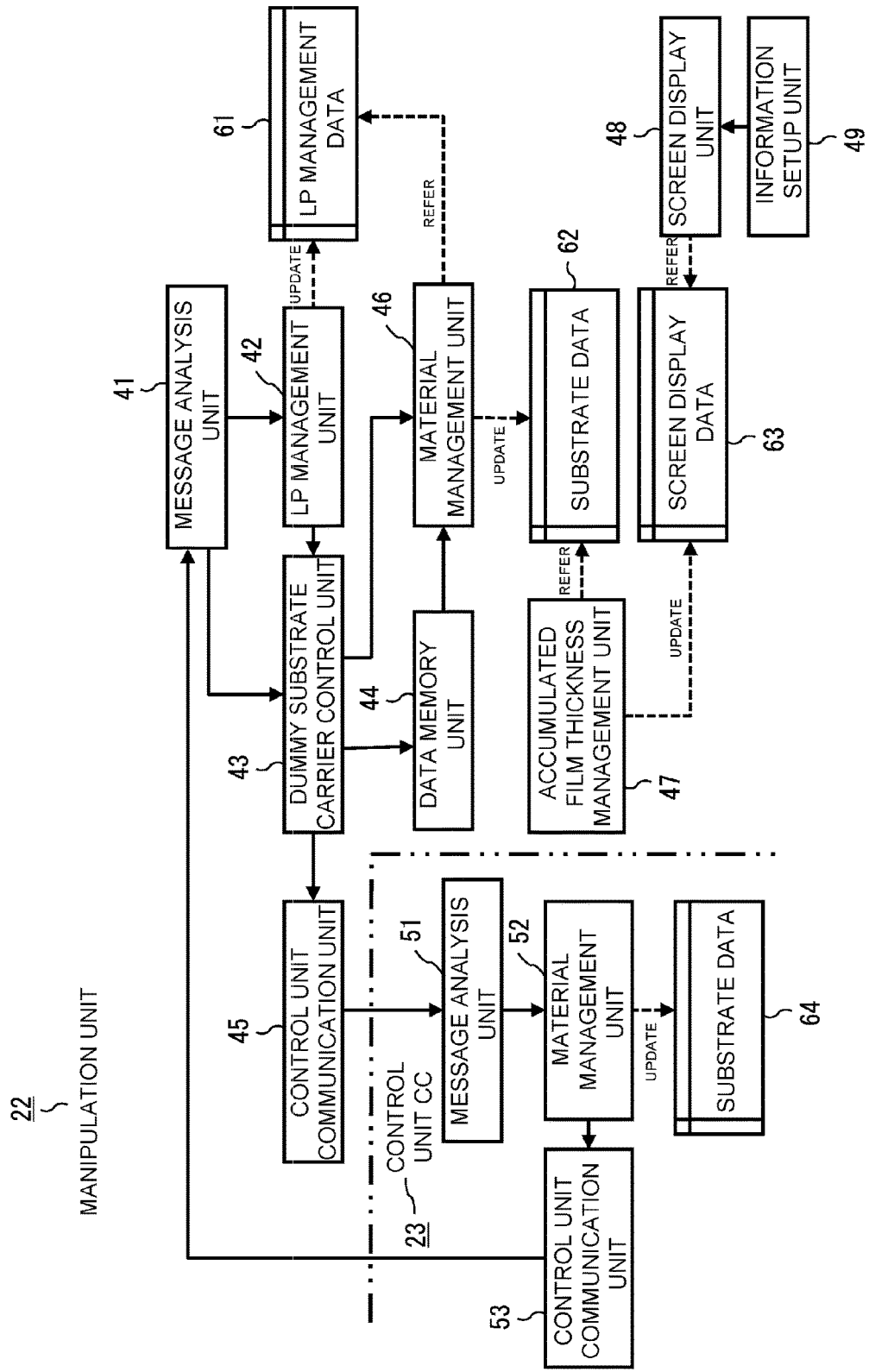
FIG. 5 is a block diagram illustrating a functional configuration of the apparatus controller of the substrate processing apparatus according to the first embodiment of the present invention.

Hereinafter, a functional configuration of the apparatus controller 20 of the substrate processing apparatus 10 of the present embodiment will be described with reference to FIG. 5. FIG. 5 is a block diagram illustrating a functional configuration of the apparatus controller 20 of the substrate processing apparatus 10 according to the first embodiment of the present invention.

The apparatus controller 20 stores a 'dummy substrate accumulated film thickness management program' in the memory device 27. When the apparatus controller 20 starts operating, or when the dummy substrate carrier C3 is placed on, for example, the loading port LP3, the placing of the dummy substrate carrier C3 is detected by a sensor to transmit a detection signal, and the apparatus controller 20 receives the detection signal, the 'dummy substrate accumulated film thickness management program' is read from the memory device 27 and is executed. In FIG. 2, the memory device 27 is shown to be separated from the manipulation unit 22 and the control unit CC 23. However, the present invention is not limited thereto. It is also possible that the memory device 27 is integrated with at least one of the manipulation unit 22 and the control unit CC 23.

When the 'dummy substrate accumulated film thickness management program' is executed, the apparatus controller 20 performs an accumulated film thickness management process, for example, the outputs of an alert signal and an alarm signal as described above. In addition, a functional configuration of the manipulation unit 22 and the control unit CC 23 of the apparatus controller 20 shown in FIG. 5 is implemented due to the execution of the 'dummy substrate accumulated film thickness management program.' That is, the manipulation unit 22 realizes functions of a message analysis unit 41, an LP management unit 42, a dummy substrate carrier control unit 43, a data memory unit 44, a control unit communication unit 45, a material management unit 46, an accumulated film thickness management unit 47, a screen display unit 48, and an information setup unit 49. In addition, the control unit CC 23 realizes functions of a message analysis unit 51, a material management unit 52, and a manipulation unit communication unit 53.

The message analysis unit 41 is configured to receive a message such as a request message or a notification message from another unit included in the manipulation unit 22 or the control unit CC 23 and distributes the received message to other units according to the content of the message.

The LP management unit 42 is configured to manage loading or unloading of the carriers CA1 through CA3 and C3 onto or from the loading ports LP1 through LP3, store management data such as a carrier authentication result as LP management data 61, and transmit a carrier authentication message to the dummy substrate carrier control unit 43.

At a time at which the dummy substrate carrier C3 is unloaded from the loading port LP3, the dummy substrate carrier control unit 43 is configured to store dummy substrate accumulated film thickness data in the data memory unit 44 and a carrier ID of the dummy substrate carrier C3 in case the same carrier is reloaded. In addition, the dummy substrate carrier control unit 43 is configured to, when the dummy substrate carrier C3 is reloaded onto the loading port LP3 and there is an accumulated film thickness automatic setting flag in the carrier authentication message received from the LP management unit 42, determine whether the carrier ID of the dummy substrate carrier C3 which is reloaded and the data stored in the data memory unit 44 are the same, read an accumulated film thickness of each dummy substrate from the data stored in the data memory unit 44 when it is determined that they are the same, and transmit a dummy substrate accumulated film thickness update request message to the control unit communication unit 45. In addition, the dummy substrate carrier control unit 43 is configured to, upon receiving a dummy substrate accumulated film thickness update response message from the message analysis unit 41, transmit the accumulated film thickness of each dummy substrate in the stored data read from the data memory unit 44 to the material management unit 46.

The data memory unit 44 is configured to store a film thickness of each dummy substrate of the dummy substrate carrier C3 when the dummy substrate carrier C3 is unloaded from the loading port LP3 under the control of the dummy substrate carrier control unit 43. In addition, the data memory unit 44 is configured to store a carrier ID which is an identifier for identifying the dummy substrate carrier C3 similar to the film thickness of the each dummy substate. That is, the data memory unit 44 is configured to function as a "memory unit" in the present invention by storing an accumulated film thickness of each dummy substrate and a carrier ID of the dummy substrate carrier C3 when the dummy substrate carrier C32 is unloaded.

The control unit communication unit 45 is configured to transmit the dummy substrate accumulated film thickness update request message received from the dummy substrate carrier control unit 43 to the message analysis unit 51 of the control unit CC 23.

The material management unit 46 is configured to, upon receiving an accumulated film thickness of each dummy substrate from the dummy substrate carrier control unit 43, update substrate data 62 which is data about a status of a dummy substrate managed by the manipulation unit 22, more particularly, an accumulated film thickness of the dummy substrate included in the substrate data 62 according to the accumulated film thickness received from the dummy substrate carrier control unit 43. That is, when the dummy substrate carrier C3 is reloaded, the material management unit 46 is configured to function as a "management unit" in the present invention by resetting an accumulated film thickness of each dummy substrate included in the substrate data 62 based on a film thickness of each dummy substrate stored in the data memory unit 44.

In order to display and output monitored information or maintenance information about the dummy substrate, the accumulated film thickness management unit 47 is configured to update screen display data 63 which is a base of the displayed and output of the monitored information or the maintenance information based on the accumulated film thickness of each dummy substrate included in the substrate data 62. Accordingly, content of an accumulated film thickness of each dummy substrate in the screen display data 63 is the same as that of the substrate data 62 after being reset. In addition, when, for example, the maintenance information is displayed and output (for example, see FIG. 4), the accumulated film thickness management unit 47 updates the screen display data 63 using a maximum value of the accumulated film thickness as a monitored value of an accumulated film thickness.

The screen display unit 48 is configured to generate an image for displaying and outputting the monitored information or the maintenance information about the dummy substrate by referring to the screen display data 63, and display and output the generated image on and to a display device of the manipulation unit 22. Examples of the image displayed and outputted by the screen display unit 48 are as follows. The examples of the image include an image (for example, see FIG. 4) for outputting information including an accumulated film thickness of the dummy substrate in the dummy substrate carrier C3 as maintenance information about the dummy substrate carrier C3 on, for example, the loading port LP3. In addition, the examples of the image include an image (for example, see FIG. 3) for outputting a table of information including an accumulated film thickness of each dummy substrate as information about each dummy substrate in the dummy substrate carrier C3 on, for example, the loading port LP3. That is, the screen display unit 48 which displays and outputs the images functions as a "maintenance information output unit" or an "information output unit" in the present invention.

The information setup unit 49 is configured to edit the accumulated film thickness included in the maintenance information according to an operation content of the operator on a screen displayed and outputted by the screen display unit 48, or edit the accumulated film thickness outputted by the table for each dummy substrate. That is, the information setup unit 49 that edits an accumulated film thickness functions as a "first setup unit" or a "second setup unit" in the embodiment of the present invention.

The message analysis unit 51 is configured to analyze a message such as a request message or a notification message between the manipulation unit 22 and the control unit CC 23 and distribute the received message to other units according to the content of the message.

The material management unit 52 is configured to, upon receiving the dummy substrate accumulated film thickness update request message from the manipulation unit 22, update substrate data 64 which is data about a status of the dummy substrate managed by the control unit CC 23, more particularly, an accumulated film thickness of the dummy substrate included in the substrate data 64 according to the accumulated film thickness in the accommodated dummy substrate accumulated film thickness update request message. That is, when the dummy substrate carrier C3 is reloaded, the material management unit 52 is configured to reset an accumulated film thickness of each dummy substrate included in the substrate data 64 based on a film thickness of each dummy substrate stored in the data memory unit 44 of the manipulation unit 22. In addition, when the accumulated film thickness of the substrate data 64 is updated according to the dummy substrate accumulated film thickness update request message, the material management unit 52 is configured to transmit a dummy substrate accumulated film thickness update response message to the manipulation unit communication unit 53.

The manipulation unit communication unit 53 is configured to transmit the dummy substrate accumulated film thickness update response message received from the material management unit 52 to the message analysis unit 41 of the manipulation unit 22.

Also, it is assumed that the manipulation unit 22 and the control unit CC 23 respectively manage the substrate data 62 and 64. However, substrate data may be managed by at least one of the manipulation unit 22 and the control unit CC 23. When only one manages the substrate data, the manipulation unit 22 and the control unit CC 23 are configured to share the same substrate data.

(7) Process when Dummy Substrate Carrier is Reloaded

A processing operation of automatically setting an accumulated film thickness of a dummy substrate when the dummy substrate carrier C3 of the substrate processing apparatus 10 according to the embodiment of the present invention is reloaded onto the loading port LP3 will be described with reference to FIG. 6.

(Automatic Setting)

Figure 6:
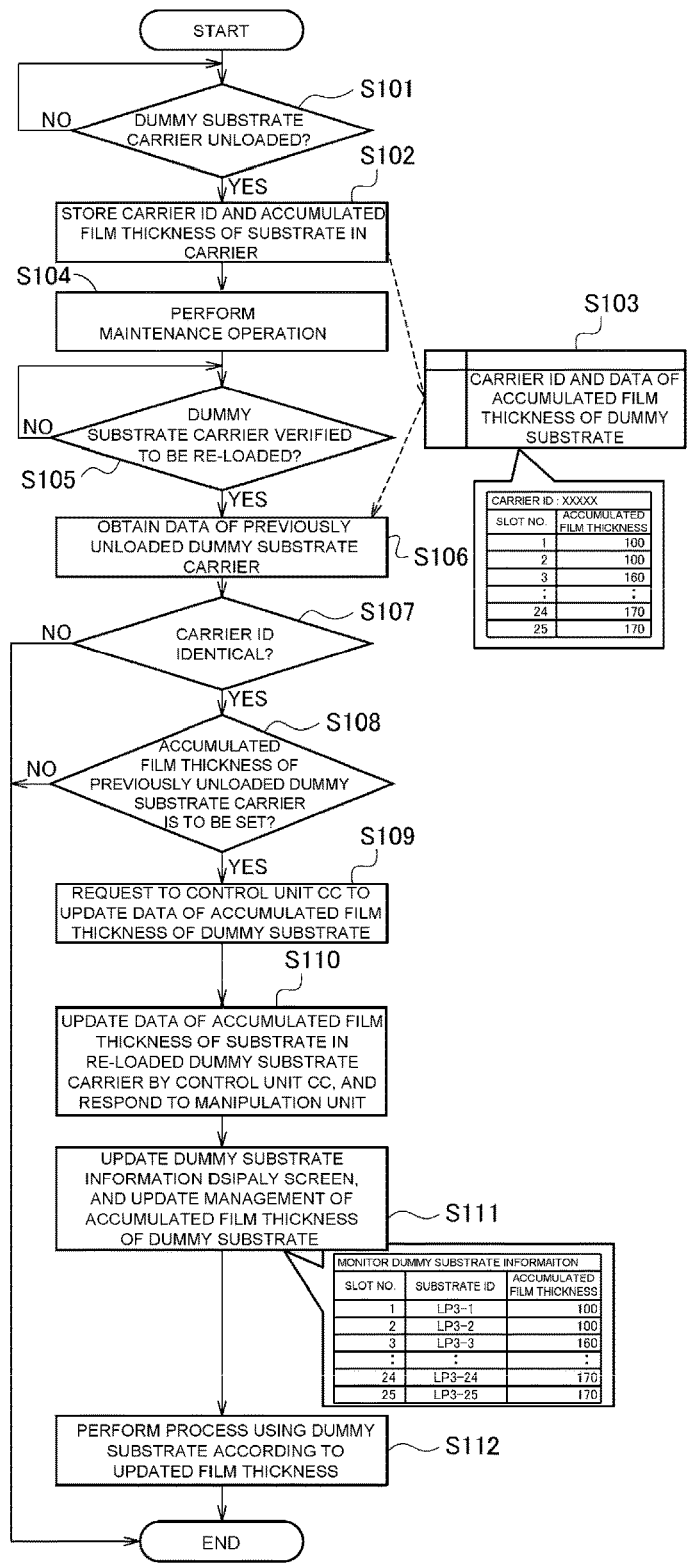
FIG. 6 is a flowchart illustrating an example of an operation of performing a process when a dummy substrate carrier is reloaded in the substrate processing apparatus according to the first embodiment of the present invention.

FIG. 6 is a flowchart illustrating an operation example of automatically setting an accumulated film thickness of a dummy substrate when a dummy substrate carrier is reloaded in the substrate processing apparatus 10 according to the first embodiment of the present invention. In addition, it is assumed that the dummy substrate carrier C3 is reloaded in the first reloading type as described above (in which a regular maintenance operation is performed).

Referring to FIG. 6, when the manipulation unit 22 recognizes that the dummy substrate carrier C3 is unloaded from the loading port LP3 using a detection result of a sensor (YES in Step 101 (hereinafter, 'Step' is abbreviated to 'S')), the dummy substrate carrier control unit 43 stores a carrier ID of the dummy substrate carrier C3 and an accumulated film thickness of each dummy substrate accommodated in the dummy substrate carrier C3 in the data memory unit 44 (S102). It is assumed that, for example, the manipulation unit 22 obtains an accumulated film thickness of each dummy substrate by accessing the substrate data 62 which the manipulation unit 22 is managing at this time. Accordingly, the data memory unit 44 is configured to store an accumulated film thickness of each dummy substrate and each slot number in a state associated with each other when the dummy substrate carrier C3 is unloaded for every carrier ID of the dummy substrate carrier C3.

After a regular maintenance operation of the loading port LP3 or the like is performed (S104), when the dummy substrate carrier C3 is reloaded onto, for example, the loading port LP3, the LP management unit 42 transmits as a carrier authentication message to the dummy substrate carrier control unit 43 with respect to a carrier authentication result for the dummy substrate carrier C3 (YES in S105). Upon receiving the carrier authentication message, the dummy substrate carrier control unit 43 accesses the data memory unit 44 and obtains data stored in the data memory unit 44, that is, data (particularly, an accumulated film thickness of each dummy substrate specified by each slot number and a carrier ID) about the dummy substrate carrier C3 which was unloaded a previous time (S106).

The dummy substrate carrier control unit 43 compares the carrier ID in accordance with the carrier authentication message with the carrier ID obtained from the data memory unit 44 and determines whether the carrier IDs are the same (S107). When the carrier IDs are the same, the dummy substrate carrier control unit 43 determines whether the accumulated film thickness of each dummy substrate is reset based on the data about the dummy substrate carrier C3 which has been unloaded in a previous time (S108). It is assumed that, for example, the determination is made based on whether a flag indicating that resetting is restricted is added to the received carrier authentication message.

As a result, when it is determined that the accumulated film thickness of each dummy substrate is reset, the dummy substrate carrier control unit 43 makes a dummy substrate accumulated film thickness update request message including the accumulated film thickness of each dummy substrate obtained from the data memory unit 44 and transmits the dummy substrate accumulated film thickness update request message to the control unit CC 23 (S109). In addition, when the carrier IDs are not the same (NO in S107) or when it is determined that resetting is not performed (NO in S108), in both the cases, at this time, the manipulation unit 22 ends the operation for resetting an accumulated film thickness of a dummy substrate.

Upon receiving the dummy substrate accumulated film thickness update request message from the manipulation unit 22, the control unit CC 23 resets the accumulated film thickness when the material management unit 52 updates the accumulated film thickness of each dummy substrate included in the substrate data 64 managed by the control unit CC 23 for the dummy substrate carrier C3 which is reloaded according to the accumulated film thickness included in the dummy substrate accumulated film thickness update request message (S110). When the accumulated film thickness is reset, the material management unit 52 transmits a dummy substrate accumulated film thickness update response message to the manipulation unit 22.

Upon receiving the dummy substrate accumulated film thickness update response message, in the manipulation unit 22, the dummy substrate carrier control unit 43 transmits the accumulated film thickness of each dummy substrate obtained from the data memory unit 44 to the material management unit 46. Accordingly, the material management unit 46 resets the accumulation film by updating the accumulated film thickness of each dummy substrate included in the substrate data 62 managed by the manipulation unit 22 according to the accumulated film thickness received from the dummy substrate carrier control unit 43 (S111). Accordingly, the content of the substrate data 62 about the dummy substrate carrier C3 which is reloaded is not cleared to zero, and is automatically reset to the same as that when the dummy substrate carrier C3 is unloaded from the loading port LP3.

Also, in the manipulation unit 22, the accumulated film thickness management unit 47 updates the screen display data 63 for displaying and outputting information about the dummy substrate based on the accumulated film thickness of each dummy substrate included in the substrate data 62 after resetting (S111). Accordingly, the operator may recognize the accumulated film thickness of the dummy substrate after being reset by seeing content displayed and output on and to a screen. Then, a substrate process is performed by using the dummy substrate according to the updated film thickness (S112). In the above, the present embodiment has been described as a configuration to be performed by a substrate processing program. However, the present embodiment is not limited thereto. For example, it is also possible that the process is carried on by the program until the accumulated film thickness of the dummy substrate is updated, and then it goes into a standby state waiting for a command from the manipulation unit 22.

(Setting of Maintenance Information)

According to the above-mentioned series of steps, when the dummy substrate carrier C3 with the same carrier ID is reloaded, the content of an accumulated film thickness of each dummy substrate in the dummy substrate carrier C3 is automatically reset to the same as that when the carrier is unloaded from the loading port LP3. However, it is considered that there are cases in which the above-mentioned series of steps may not be used for certain reasons.

Figure 7:
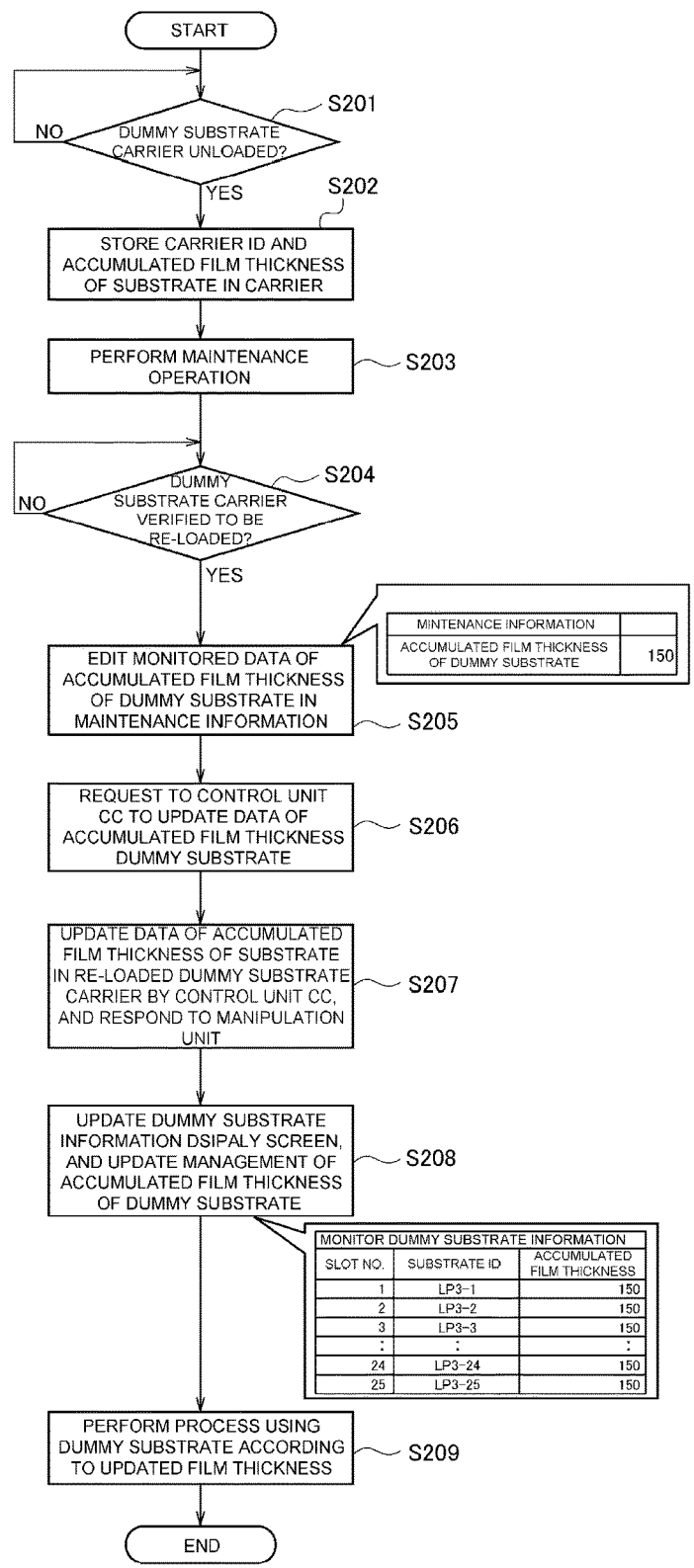
FIG. 7 is a flowchart illustrating an operation example of a process of setting maintenance information when the dummy substrate carrier is reloaded in the substrate processing apparatus according to the first embodiment of the present invention.

Accordingly, the substrate processing apparatus 10 according to the present embodiment may reset an accumulated film thickness of each dummy substrate using the following operation order. FIG. 7 is a flowchart illustrating an operation example of setting maintenance information when a dummy substrate carrier is reloaded in the substrate processing apparatus 10 according to the first embodiment of the present invention.

Referring to FIG. 7, the operation order which is performed until the dummy substrate carrier C3 is reloaded onto, for example, the loading port LP3 (S201 through S204) are substantially the same as those when an accumulated film thickness is automatically set as described above (see FIG. 6).

Next, the manipulation unit 22 displays and outputs maintenance information using the screen display unit 48 by referring to the screen display data 63 managed by the accumulated film thickness management unit 47. In detail, information including an accumulated film thickness of a dummy substrate in the dummy substrate carrier C3 is displayed and output as maintenance information about the dummy substrate carrier C3 on the loading port LP3 on and to the screen display unit 48 (S205). A maximum value of the accumulated film thickness from among dummy substrates in the dummy substrate carrier C3 is monitored and displayed on a management screen of the maintenance information which is displayed and output at this time (for example, see FIG. 4). When a monitored value of the accumulated film thickness on the management screen of the maintenance information is edited by the operator, the information setup unit 49 receives a result of the editing and edits the monitored value of the accumulated film thickness (S205). That is, the monitored value (that is, a representative value) of the accumulated film thickness is reset by the operator.

When the monitored value of the accumulated film thickness is reset, the dummy substrate carrier control unit 43 makes a dummy substrate accumulated film thickness update request message including the reset monitored value and transmits the dummy substrate accumulated film thickness update request message to the control unit CC 23 (S206).

Upon receiving the dummy substrate accumulated film thickness update request message from the manipulation unit 22, the control unit CC 23 resets the accumulated film thickness when the material management unit 52 collectively updates the accumulated film thickness of each dummy substrate included in the substrate data 64 managed by the control unit CC 23 for the dummy substrate carrier C3 which is reloaded according to the monitored value included in the dummy substrate accumulated film thickness update request message (S207). When the accumulated film thickness is reset, the material management unit 52 transmits a dummy substrate accumulated film thickness update response message to the manipulation unit 22.

Upon receiving the dummy substrate accumulated film thickness update response message, in the manipulation unit 22, the dummy substrate carrier control unit 43 transmits the monitored value of the accumulated film thickness received and edited by the information setup unit 49 to the material management unit 46. Accordingly, the material management unit 46 resets the accumulated film thickness by collectively updating the accumulated film thickness of each dummy substrate included in the substrate data 62 managed by the manipulation unit 22 to the monitored value received from the dummy substrate carrier control unit 43 (S208). Accordingly, the content of the substrate data 62 about the dummy substrate carrier C3 which is reloaded is not cleared to zero, and the accumulated film thickness of each dummy substrate is collectively reset using the monitored value edited on the management screen of the maintenance information. Then, a substrate process is performed by using the dummy substrate according to the updated film thickness (S209). In the above, the present embodiment has been described as a configuration to be performed by a substrate processing program. However, the present embodiment is not limited thereto. For example, it is also possible that the process is carried on by the program until the accumulated film thickness of the dummy substrate is updated, and then it goes into a standby state waiting for a command from the manipulation unit 22.

(Setting of Dummy Substrate Information)

Figure 8:
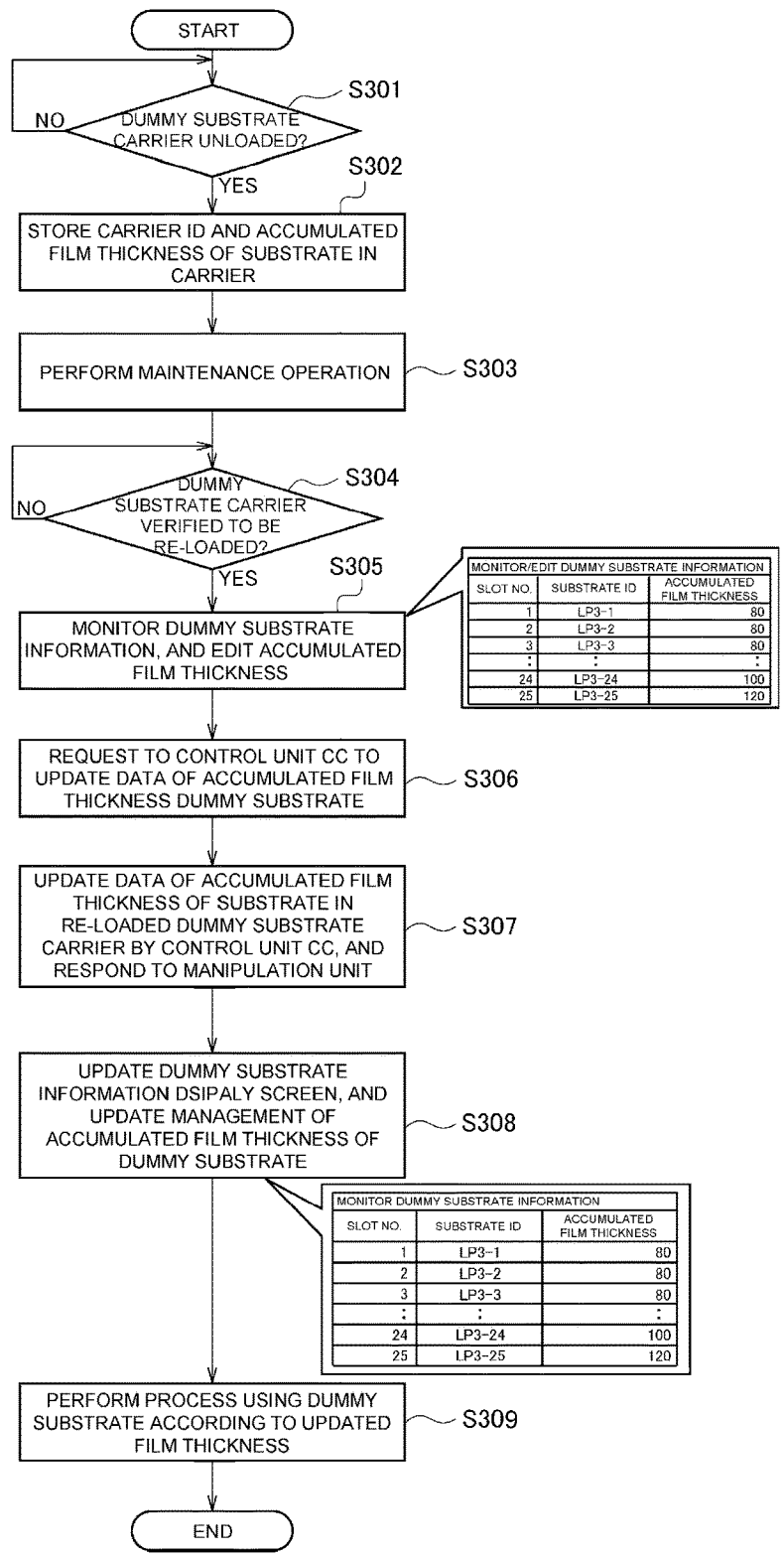
FIG. 8 is a flowchart illustrating an operation example of a process of setting dummy substrate information when the dummy substrate carrier is reloaded in the substrate processing apparatus according to the first embodiment of the present invention.

Also, the substrate processing apparatus 10 of the present embodiment may reset an accumulated film thickness of each dummy substrate using the following operation order. FIG. 8 is a flowchart illustrating an operation example of setting dummy substrate information when a dummy substrate carrier is reloaded in the substrate processing apparatus 10 according to the first embodiment of the present invention.

Referring to FIG. 8, the operation order which is performed until the dummy substrate carrier C3 is reloaded onto, for example, the loading port LP3 (S301 through S304), are substantially the same as those when an accumulated film thickness is automatically set as described above (see FIG. 6).

Next, the manipulation unit 22 displays and outputs information about each dummy substrate defined as a table by the screen display unit 48 by referring to the screen display data 63 managed by the accumulated film thickness management unit 47. In detail, a table showing information including an accumulated film thickness of each dummy substrate as information about each dummy substrate in the dummy substrate carrier C3 on the loading port LP3 is displayed and outputted by the screen display unit 48 (S305). In the information about each dummy substrate which is displayed and output at this time, an accumulated film thickness of each dummy substrate is individually displayed to correspond to a slot number in the dummy substrate carrier C3 (for example, see FIG. 3). When each accumulated film thickness is individually edited by the operator on a display screen of information about each dummy substrate, the information setup unit 49 receives a result of the editing and edits the accumulated film thickness (S305). That is, each accumulated film thickness is individually reset by an operation of the operator as necessary.

When each accumulated film thickness is reset, the dummy substrate carrier control unit 43 makes a dummy substrate accumulated film thickness update request message including the reset accumulated film thickness and transmits the dummy substrate accumulated film thickness update request message to the control unit CC 23 (S306).

Upon receiving the dummy substrate accumulated film thickness update request message from the manipulation unit 22, the control unit CC 23 resets the accumulated film thickness when the material management unit 52 individually updates the accumulated film thickness of each dummy substrate included in the substrate data 64 managed by the control unit CC 23 for the dummy substrate carrier C3 which is reloaded according to each accumulated film thickness included in the dummy substrate accumulated film thickness update request message (S307). When the accumulated film thickness is reset, the material management unit 52 transmits a dummy substrate accumulated film thickness update response message to the manipulation unit 22.

Upon receiving the dummy substrate accumulated film thickness update response message, in the manipulation unit 22, the dummy substrate carrier control unit 43 transmits an accumulated film thickness which has been received and edited by the information setup unit 49 to the material management unit 46. Accordingly, the material management unit 46 resets the accumulated film thickness by individually updating the accumulated film thickness of each dummy substrate included in the substrate data 62 managed by the manipulation unit 22 according to each accumulated film thickness received from the dummy substrate carrier control unit 43 (S308). Accordingly, the content of the substrate data 62 about the dummy substrate carrier C3 which is reloaded is not cleared to zero, and the accumulated film thickness of each dummy substrate is individually reset according to each accumulated film thickness edited on a display screen of information about each dummy substrate. Then, a substrate process is performed by using the dummy substrate according to the updated film thickness (S309). In the above, the present embodiment has been described as a configuration to be performed by a substrate processing program. However, the present embodiment is not limited thereto. For example, it is also possible that the process is carried on by the program until the accumulated film thickness of the dummy substrate is updated, and then it goes into a standby state waiting for a command from the manipulation unit 22.

(8) Effects of the Present Embodiment

According to the present embodiment, one or more of the following effects are provided as examples.

(a) According to the present embodiment, even when the dummy substrate carrier C3 on the loading port LP3 is unloaded in the substrate processing apparatus 10 in which the dummy substrate carrier C3 is placed on, for example, the loading port LP3, since an accumulated film thickness of each dummy substrate may be continuously managed by previously storing an accumulated film thickness of each dummy substrate in the dummy substrate carrier C3, the accumulated film thickness of each dummy substrate may be reset when the dummy substrate carrier C3 is reloaded onto the loading port LP3.

Accordingly, according to the present embodiment, even when the dummy substrate carrier C3 on the loading port LP3 is unloaded, since an accumulated film thickness of each dummy substrate in the dummy substrate carrier C3 may be reset, a dummy substrate does not need to be exchanged with a new one whenever the dummy substrate carrier C3 is unloaded and a dummy substrate may be efficiently used until a number of dummy substrates reached a preset limit value of the accumulated film thickness. For example, assuming that film formation of forming a SiO film to a thickness of about 10 nm in the process chambers PM1 and PM2 for one time is performed, when a limit value of the accumulated film thickness limit value of a dummy substrate is set as 1,000 nm (for the SiO film), one dummy substrate may be used by 100 times. In detail, for example, when film formation is performed 4 times a day, one dummy substrate is used for one time, two process chambers PM1 and PM2 are assumed to be used, and calculation is performed, a number of times a dummy substrate which is used a day is 8 (4 times×1 dummy substrate×2 process chambers). When 25 dummy substrates are on the dummy substrate carrier C3, a number of times all of the dummy substrates which are used until they reach the limit value of the accumulated film thickness is 2,500 (25 dummy substrates× 100 times), and a number of days taken until they reach the limit value is about 300 (2,500 times÷8 times). As such, since one dummy substrate carrier C3 which first starts to be used is continuously used for a long time (for example, about 300 days), the probability of the dummy substrate carrier C3 being temporarily unloaded from the loading port LP3 due to, for example, a regular maintenance operation, is high. Accordingly, as in the present embodiment, it is configured so that an accumulated film thickness of each dummy substrate can be reset, and thus each dummy substrate may be efficiently used until it reaches the limit value of the accumulated film thickness.

(b) Also, according to the present embodiment, even when the dummy substrate carrier C3 on the loading port LP3 is unloaded, since an accumulated film thickness of each dummy substrate may be continuously managed by resetting an accumulated film thickness of each dummy substrate when the dummy substrate carrier C3 is reloaded, there is no case in which a dummy substrate is used incorrectly even after the accumulated film thickness exceeds the limit value when it reaches the limit value. That is, the risk which becomes a cause of generating particles in the substrate processing apparatus 10 due to incorrect use of a dummy substrate may be avoided beforehand.

(c) Also, according to the present embodiment, even when the dummy substrate carrier C3 is unloaded from the loading port LP3 due to, for example, a regular maintenance operation, prior to a dummy substrate exchange cycle based on an accumulated film thickness, since an accumulated film thickness of each dummy substrate may be continuously managed after the dummy substrate carrier C3 is reloaded, a dummy substrate may be exchanged only when it is necessary, and the waste of costs may be reduced compared to those when a dummy substrate is exchanged whenever the dummy substrate carrier C3 is unloaded.

(d) Also, according to the present embodiment, any dummy substrate from among a plurality of dummy substrates in the dummy substrate carrier C3 which does not reach a limit value of an accumulated film thickness may be accurately managed by continuously managing an accumulated film thickness of each dummy substrate through unloading and reloading of the dummy substrate carrier C3. Accordingly, even when particles are generated in the substrate processing apparatus 10 due to a dummy substrate in the dummy substrate carrier C3, only a dummy substrate which reaches the limit value of the accumulated film thickness may be exchanged with a new one, and the waste of costs may be reduced compared to those when all dummy substrates are exchanged for every dummy substrate carrier C3.

(e) Also, according to the present embodiment, although an accumulated film thickness of each dummy substrate is automatically reset in principle when the dummy substrate carrier C3 is reloaded (for example, see FIG. 6), even when an accumulated film thickness may not be automatically reset for certain reasons, the operator may set an accumulated film thickness using a management screen of maintenance information (for example, see FIG. 7) or using a table display screen of information about each dummy substrate (for example, see FIG. 8). That is, the operator may also reset an accumulated film thickness. Accordingly, the operator may directly reflect a desired accumulated film thickness, and a degree of freedom or convenience in operating the substrate processing apparatus 10 may be increased. In particular, although it is assumed that when the substrate processing apparatus 10 starts, there are too many instances in which a screen is manipulated by the operator offline, prior preparation of a function by which the operator may directly set an accumulated film thickness is very helpful for the operator.

(f) Also, according to the present embodiment, it is assumed that when the dummy substrate carrier C3 may be reloaded and the reloading type is in the first reloading type according to a regular maintenance operation. Accordingly, the substrate processing apparatus 10 may stably operate without problems or malfunctions due to the regular maintenance operation, and one or more of the effects (a) through (e) may be provided.

(g) Also, according to the present embodiment, it is assumed that when the dummy substrate carrier C3 may be reloaded and the reloading type is in the second reloading type in which a dummy substrate used by another apparatus is reused. Accordingly, since a dummy substrate is reused, the dummy substrate may be effectively used, the waste of costs may be reduced, and one or more of the effects (a) through (e) may be provided. In particular, in the second reloading type, the operator may effectively set an accumulated film thickness as described in the effect (e). However, when a function by which an accumulated film thickness of a dummy substrate used by another apparatus is obtained from the other apparatus is previously established, the operator may automatically set an accumulated film thickness in principle without directly setting the accumulation film.

(h) Also, according to the present embodiment, it is assumed that when the dummy substrate carrier C3 may be reloaded and the reloading type is in the third reloading type according to an apparatus modifying work. Accordingly, a function or performance of the substrate processing apparatus 10 may be improved due to the apparatus modifying work, and one or more of the effects (a) through (e) may be provided. In particular, when the apparatus modifying work is performed as in the third reloading type, although the probability of the dummy substrate carrier C3 being temporarily unloaded before the substrate processing apparatus 10 stably operates is expected to be high, even in this case, the accumulated film thickness may be continuously managed by resetting an accumulated film thickness of each dummy substrate.

(i) Also, according to the present embodiment, it is assumed that when the dummy substrate carrier C3 may be reloaded and the reloading type is in the fourth reloading type in which a dummy substrate is not needed for a long time. Accordingly, the substrate processing apparatus 10 may be efficiently used by securing all of the loading ports LP1 through LP3 for the carriers CA1 through CA3 in which product substrates are accommodated, and one or more of the effects (a) through (e) may be provided.

<Second Embodiment of Present Invention>

A second embodiment of the present invention will now be described.

A case in which the carriers CA1 through CA3 and C3 are automatically transferred using an automated material handling system (AMHS) will be described in the present embodiment. The AMHS is a system that automatically transfers the substrate W between the loading ports LP1 through LP3 of the substrate processing apparatus 10 or between wafer AMHS apparatuses in a semiconductor production line in a state in which the substrate W is accommodated in the carriers CA1 through CA3 and C3.

(9) Process when Dummy Substrate Carrier is Reloaded

An operation of resetting an accumulated film thickness of a dummy substrate when the dummy substrate carrier C3 is reloaded onto the loading port LP3 in the present embodiment is mainly different from that in the first embodiment.

(Automatic Setting)

Figure 9:
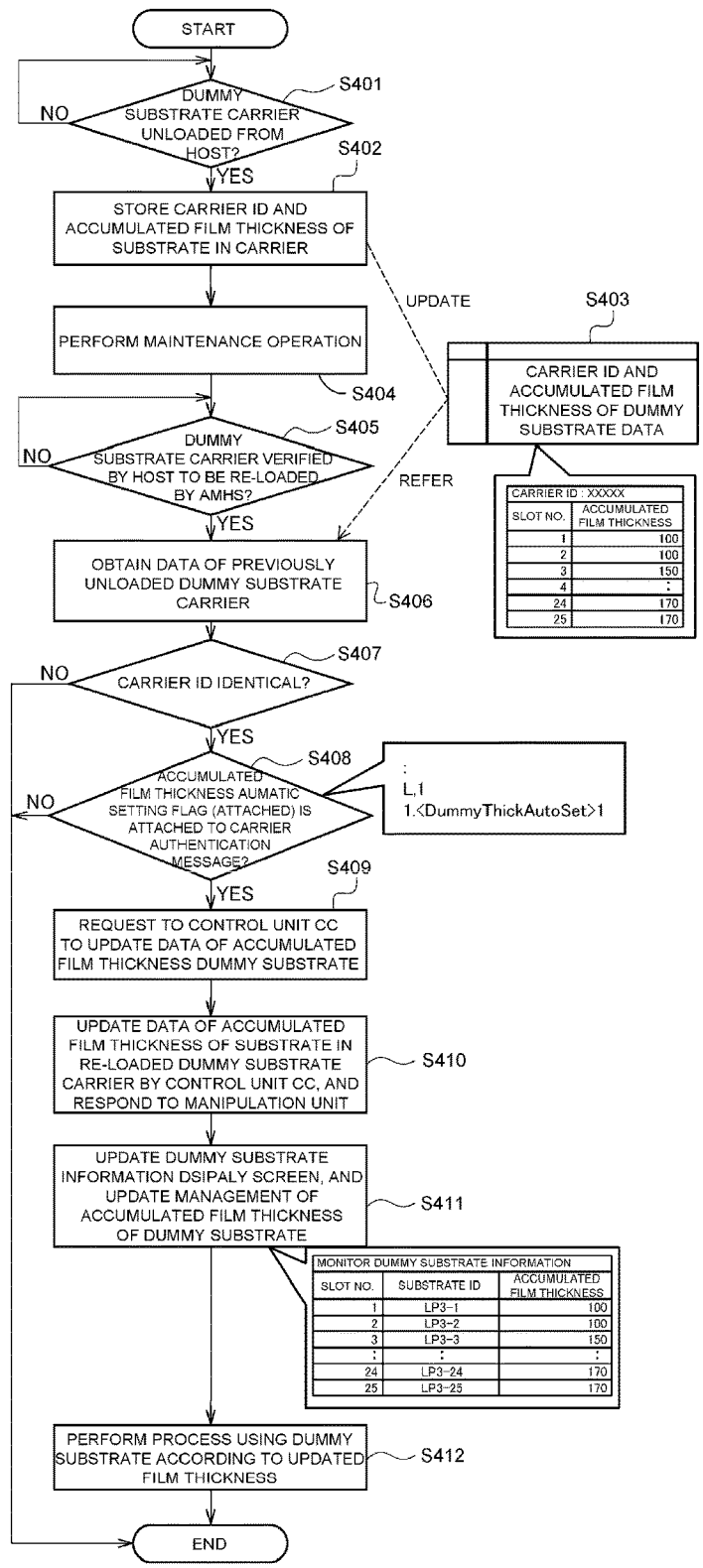
FIG. 9 is a flowchart illustrating an operation example of a process of performing an automatic setting operation when a dummy substrate carrier is reloaded in a substrate processing apparatus according to a second embodiment of the present invention.

FIG. 9 is a flowchart illustrating an operation of automatically setting an accumulated film thickness when a dummy substrate carrier is reloaded in the substrate processing apparatus 10 according to a second embodiment of the present invention. In addition, like in the first embodiment, it is assumed that the dummy substrate carrier C3 is reloaded in the first reloading type (that is, using a regular maintenance operation).

Referring to FIG. 9, the operation order which is performed until the dummy substrate carrier C3 is unloaded and then a regular maintenance operation is performed (S401 through S404) are substantially the same as those when an accumulated film thickness is automatically set in the first embodiment (see FIG. 6).

After the regular maintenance operation is performed, when the dummy substrate carrier C3 is reloaded onto, for example, the loading port LP3 by the AMHS, a carrier authentication message about the dummy substrate carrier C3 is transmitted from the host computer 30 (S405). It is assumed that additional data indicating an 'accumulated film thickness automatic setting flag (attached)' is added to the carrier authentication message by the host computer 30. When the carrier authentication message to which the additional data is added is received (YES in S405), the dummy substrate carrier control unit 43 accesses the data memory unit 44 and obtains data stored in the data memory unit 44, that is, data (particularly, a carrier ID and an accumulated film thickness of each dummy substrate) about the dummy substrate carrier C3 which is unloaded a previous time (S406).

The dummy substrate carrier control unit 43 compares the carrier ID of the carrier authentication message with the carrier ID obtained from the data memory unit 44 and determines whether the carrier IDs are the same (S407). When the carrier IDs are the same, the dummy substrate carrier control unit 43 determines whether the additional data indicating the 'accumulated film thickness automatic setting flag (attached)' is in the carrier authentication message (S408).

As a result, when the additional data indicating the 'accumulated film thickness automatic setting flag (attached)' is there, the dummy substrate carrier control unit 43 makes a dummy substrate accumulated film thickness update request message including the accumulated film thickness of each dummy substrate obtained from the data memory unit 44, and transmits the dummy substrate accumulated film thickness update request message to the control unit CC 23 (S409). In addition, when the carrier IDs are not the same (NO in S407) or the additional data indicating the 'accumulated film thickness automatic setting flag (attached)' is not there (NO in S408), at this time, the manipulation unit 22 ends the operation of resetting an accumulated film thickness of a dummy substrate.

Upon receiving a dummy substrate accumulated film thickness update response message, in the manipulation unit 22, the dummy substrate carrier control unit 43 transmits the accumulated film thickness of each dummy substrate obtained from the data memory unit 44 to the material management unit 46. Accordingly, the material management unit 46 resets the accumulated film thickness by updating the accumulated film thickness of each dummy substrate included in the substrate data 62 managed by the manipulation unit 22 according to the accumulated film thickness received from the dummy substrate carrier control unit 43 (S411). Accordingly, the content of the substrate data 62 about the dummy substrate carrier C3 which is reloaded is not cleared to zero, and is automatically reset to the same as that when the dummy substrate carrier C3 is unloaded from the loading port LP3. Then, a substrate process is performed by using the dummy substrate according to the updated film thickness (S412). In the above, the present embodiment has been described as a configuration to be performed by a substrate processing program. However, the present embodiment is not limited thereto. For example, it is also possible that the process is carried on by the program until the accumulated film thickness of the dummy substrate is updated, and then it goes into a standby state waiting for a command from the manipulation unit 22.

Also, in the manipulation unit 22, the accumulated film thickness management unit 47 updates the screen display data 63 for displaying and outputting information about a dummy substrate based on the accumulated film thickness of each dummy substrate included in the substrate data 62 after resetting (S411). Accordingly, the operator may recognize the accumulated film thickness of the dummy substrate after being reset by seeing content displayed and output on and to a screen.

(Setting of Maintenance Information)

According to the above-mentioned series of steps, when the dummy substrate carrier C3 with the same carrier ID is reloaded, the content of an accumulated film thickness of each dummy substrate in the dummy substrate carrier C3 when the dummy substrate carrier C3 is reloaded is automatically reset to the same as that when the dummy substrate carrier C3 is unloaded from the loading port LP3. However, there are cases in which the above-mentioned series of steps may not be used for certain reasons.

Figure 10:
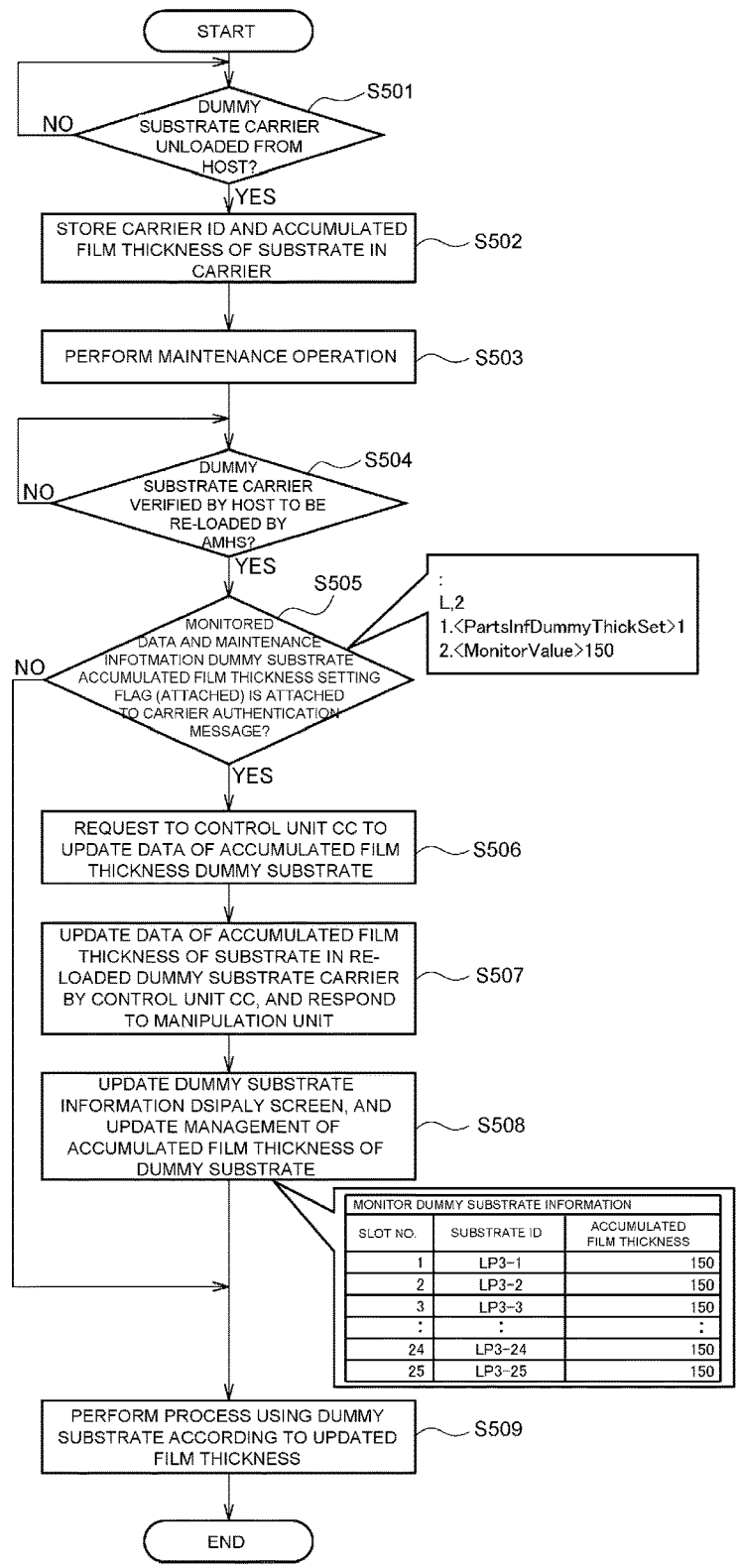
FIG. 10 is a flowchart illustrating an operation example of a process of setting maintenance information when the dummy substrate carrier is reloaded in the substrate processing apparatus according to the second embodiment of the present invention.

Accordingly, the substrate processing apparatus 10 according to the present embodiment may reset an accumulated film thickness of each dummy substrate using the following operation order. FIG. 10 is a flowchart illustrating an operation of setting maintenance information when a dummy substrate carrier is reloaded in the substrate processing apparatus 10 according to the second embodiment of the present invention.

Referring to FIG. 10, the operation order which is performed until the dummy substrate carrier C3 is unloaded and then a regular maintenance operation is performed (S501 through S503) are substantially the same as those when an accumulated film thickness is automatically set (see FIG. 9).

After the regular maintenance operation is performed, when the dummy substrate carrier C3 is reloaded onto, for example, the loading port LP3, by the AMHS, a carrier authentication message about the dummy substrate carrier C3 is transmitted from the host computer 30 (YES in S504). It is assumed that additional data indicating a 'maintenance information dummy substrate accumulated film thickness setting flag (attached)' and a 'monitored value of an accumulated film thickness' is added to the carrier authentication message by the host computer 30.

When the carrier authentication message to which the additional data is added is received (YES in S505), the dummy substrate carrier control unit 43 makes a dummy substrate accumulated film thickness update request message including the added monitored value of the accumulated film thickness and transmits the dummy substrate accumulated film thickness update request message to the control unit CC 23 (S506).

Upon receiving the dummy substrate accumulated film thickness update request message from the manipulation unit 22, the control unit CC 23 resets the accumulated film thickness when the material management unit 52 collectively updates the accumulated film thickness of each dummy substrate included in the substrate data 64 managed by the control unit CC 23 for the dummy substrate carrier C3 which is reloaded according to the monitored value included in the dummy substrate accumulated film thickness update request message (S507). When the accumulated film thickness is reset, the material management unit 52 transmits a dummy substrate accumulated film thickness update response message to the manipulation unit 22.

Upon receiving the dummy substrate accumulated film thickness update response message, in the manipulation unit 22, the dummy substrate carrier control unit 43 transmits the monitored value of the accumulated film thickness added to the carrier authentication message to the material management unit 46. Accordingly, the material management unit 46 resets the accumulated film thickness by collectively updating the accumulated film thickness of each dummy substrate included in the substrate data 62 managed by the manipulation unit 22 according to the monitored value received from the dummy substrate carrier control unit 43 (S508). Accordingly, the content of the substrate data 62 about the dummy substrate carrier C3 which is reloaded is not cleared to zero, and the accumulated film thickness of each dummy substrate is collectively reset according to the monitored value added to the carrier authentication message from the host computer 30. Then, a substrate process is performed by using the dummy substrate according to the updated film thickness (S509). In the above, the present embodiment has been described as a configuration to be performed by a substrate processing program. However, the present embodiment is not limited thereto. For example, it is also possible that the process is carried on by the program until the accumulated film thickness of the dummy substrate is updated, and then it goes into a standby state waiting for a command from the manipulation unit 22.

(Setting of Dummy Substrate Information)

Figure 11:
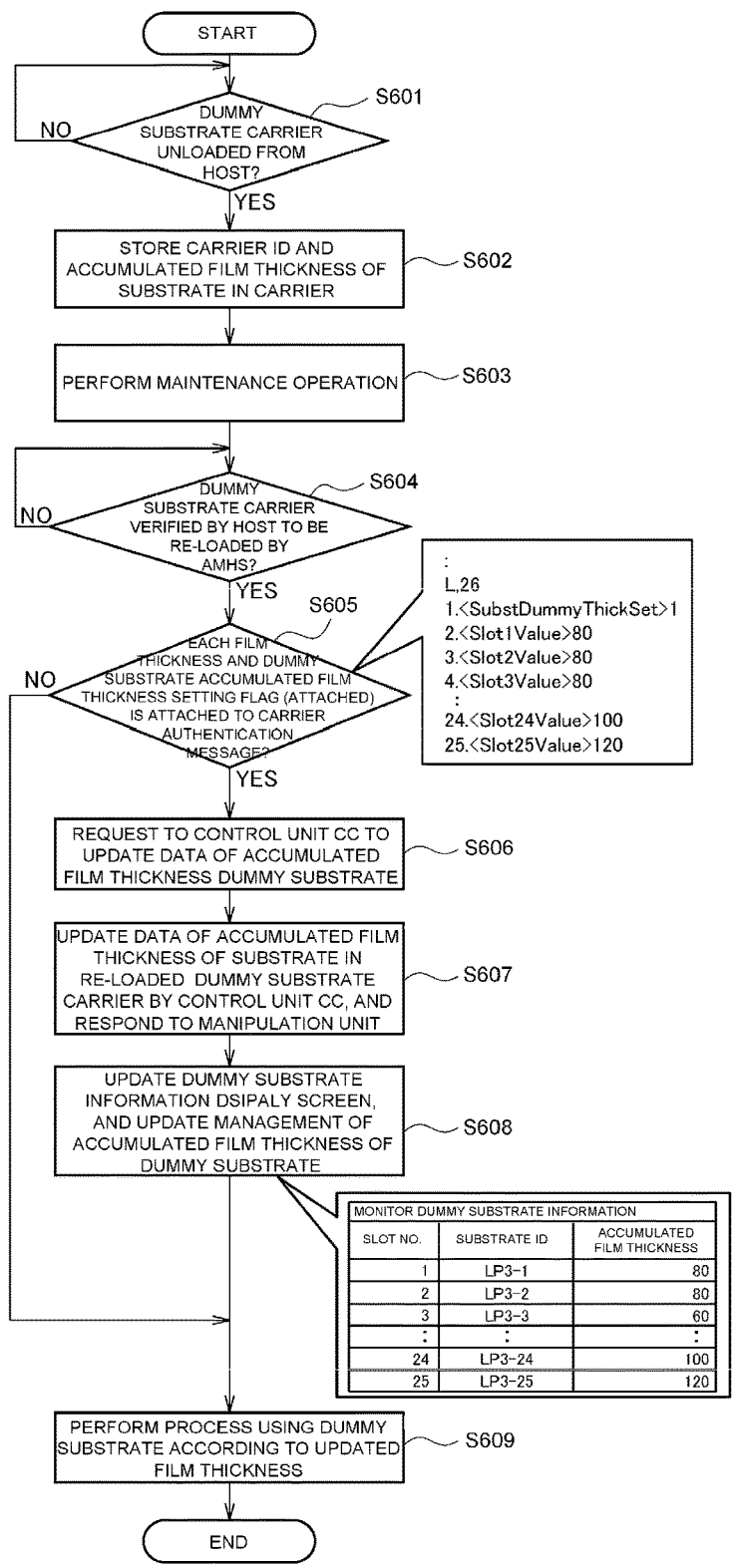
FIG. 11 is a flowchart illustrating an operation example of a process of setting dummy substrate information when the dummy substrate carrier is reloaded in the substrate processing apparatus according to the second embodiment of the present invention.

Also, the substrate processing apparatus 10 according to the present embodiment may reset an accumulated film thickness of each dummy substrate by the following operation order. FIG. 11 is a flowchart illustrating an operation example of setting dummy substrate information when a dummy substrate carrier is reloaded in the substrate processing apparatus 10 according to the second embodiment of the present invention.

Referring to FIG. 11, the operation order which is performed until the dummy substrate carrier C3 is unloaded and then a regular maintenance operation is performed (S601 through S603) are substantially the same as those when an accumulated film thickness is automatically set (see FIG. 9).

After the regular maintenance operation is performed, when the dummy substrate carrier C3 is reloaded onto, for example, the loading port LP3, by the AMHS, a carrier authentication message about the dummy substrate carrier C3 is transmitted from the host computer 30 (YES in S604). It is assumed that additional data indicating a 'dummy substrate accumulated film thickness setting flag (attached)' and an 'accumulated film thickness of each dummy substrate' is added to the carrier authentication message by the host computer 30.

Upon receiving the carrier authentication message to which the additional data is added (YES in S605), the dummy substrate carrier control unit 43 makes a dummy substrate accumulated film thickness update request message including the added accumulated film thickness of each dummy substrate and transmits the dummy substrate accumulated film thickness update request message to the control unit CC 23 (S606).

Upon receiving the dummy substrate accumulated film thickness update request message from the manipulation unit 22, the control unit CC 23 resets the accumulated film thickness when the material management unit 52 individually updates the accumulated film thickness of each dummy substrate included in the substrate data 64 managed by the control unit CC 23 for the dummy substrate carrier C3 which is reloaded according to each accumulated film thickness included in the dummy substrate accumulated film thickness update request message (S607). When the accumulated film thickness is reset, the material management unit 52 transmits a dummy substrate accumulated film thickness update response message to the manipulation unit 22.

Upon receiving the dummy substrate accumulated film thickness update response message, in the manipulation unit 22, the dummy substrate carrier control unit 43 transmits the accumulated film thickness of each dummy substrate added to the carrier authentication message to the material management unit 46. Accordingly, the material management unit 46 resets the accumulated film thickness by individually updating the accumulated film thickness of each dummy substrate included in the substrate data 62 managed by the manipulation unit 22 according to each accumulated film thickness received from the dummy substrate carrier control unit 43 (S608). Accordingly, the content of the substrate data 62 about the dummy substrate carrier C3 which is reloaded is not cleared to zero, and the accumulation thickness of each dummy substrate is individually reset according to each accumulated film thickness added to the carrier authentication message from the host computer 30. Then, a substrate process is performed by using the dummy substrate according to the updated film thickness (S609). In the above, the present embodiment has been described as a configuration to be performed by a substrate processing program. However, the present embodiment is not limited thereto. For example, it is also possible that the process is carried on by the program until the accumulated film thickness of the dummy substrate is updated, and then it goes into a standby state waiting for a command from the manipulation unit 22.

(Others)

Also, there are cases in which an accumulated film thickness according to a change in a status of a dummy substrate is event-reported from the substrate processing apparatus 10 between the substrate processing apparatus 10 and the host computer 30 (SEMI E 90: specification for substrate tracking). In these cases, it is assumed that when event-reporting as described above, additional data is added to a carrier authentication message using the accumulated film thickness which is event-reported when maintenance information is set using a carrier authentication message from the host computer 30 (see FIG. 10) or when dummy substrate information is set (see FIG. 11).

(10) Effects of the Present Embodiment

According to the present embodiment, one or more of the following effects are provided as examples in addition to the effects of the first embodiment.

(j) According to the present embodiment, since a carrier may be automatically transferred by the AMHS, productivity may be very effectively improved in a semiconductor production line.

(k) Also, according to the present embodiment, an accumulated film thickness of a dummy substrate from the host computer 30 may be reset. In addition, in this case, when an event report from, for example, the substrate processing apparatus 10, is used, an accumulated film thickness of a dummy substrate need not be managed by the host computer 30 in consideration of reloading of a carrier.

(l) Also, according to the present embodiment, although there is a need for the host computer 30 to add an accumulated film thickness as additional data to a carrier authentication message, in the second reloading type in which a dummy substrate used by another apparatus is reused, an accumulated film thickness set and managed by the another apparatus may be used online. In addition, even in the first through fourth reloading types, if an accumulated film thickness is event-reported according to a change in a status of a dummy substrate from the substrate processing apparatus 10 for every substrate, the host computer 30 may set additional data by using data according to the event report.

<Other Embodiments of Present Invention>

While the embodiments of the present invention have been described in detail, the present invention is not limited thereto and may be modified in various ways without departing from the scope of the present invention.

For example, although an example in which the substrate receiving unit on which a dummy substrate carrier is placed is configured as the loading ports LP1 through LP3 is described in the embodiments, the present invention is not limited to the embodiments. For example, a shelf or a stand may be provided at a side in the air transfer chamber EFEM of FIG. 1 (at a right side and/or a left side in FIG. 1) or at a side in the transfer chamber TM (a right side and/or a left side in FIG. 1) and may be used as a substrate receiving unit on which a dummy substrate carrier is placed.

For example, when a series of functions is performed when the apparatus controller 20 executes a 'dummy substrate accumulated film thickness management program,' although the 'dummy substrate accumulated film thickness management program' is already installed in the apparatus controller 20 in the embodiments, the 'dummy substrate accumulated film thickness management program' may be provided through a communication line connected to the apparatus controller 20 before being installed in the apparatus controller 20, or may be provided by being stored in a recording medium that may be read by the apparatus controller 20.

For example, although a product substrate to be processed is a semiconductor wafer substrate in the embodiments, the present invention is not limited thereto, and may be applied to a substrate processing apparatus for processing a glass substrate such as a liquid crystal display (LCD) apparatus.

Also, although a process performed by the substrate processing apparatus 10 is film formation in the embodiments, the present embodiment is not limited thereto. That is, a process of forming an oxide film or a nitride film or a process of forming a film including a metal may be used instead of the film formation. In addition, a specific substrate process is not limited, and the present invention may be preferably applied to any of other substrate processes such as annealing, oxidation, nitridation, diffusion, and lithography instead of film formation. In addition, the present invention may be preferably applied to any of other substrate processing apparatuses, for example, an annealing apparatus, an oxidation apparatus, a nitridation apparatus, an exposure apparatus, a coating apparatus, a drying apparatus, a heating apparatus, and a processing apparatus using plasma.

According to the present invention, a substrate processing apparatus may update an accumulated film thickness of each dummy substrate when a dummy substrate carrier is reloaded.

<Preferred Embodiments of Present Invention>

Hereinafter, preferred embodiments of the present invention will be added.

[Supplementary Note 1]

According to an embodiment of the present invention, there is provided a substrate processing apparatus including a process chamber in which a predetermined number of various substrates are collectively processed, the substrate processing apparatus including:

a substrate receiving unit on which a dummy substrate carrier in which a dummy substrate that is at least one type of the various substrates is accommodated is placed;

a memory unit configured to store a film thickness of each dummy substrate in the dummy substrate carrier when the dummy substrate carrier is unloaded from the substrate receiving unit; and a management unit configured to update the film thickness of each dummy substrate in the dummy substrate carrier based on the film thickness stored in the memory unit when the dummy substrate carrier is reloaded onto the substrate receiving unit.

[Supplementary Note 2]

Preferably, in the substrate processing apparatus according to Supplementary Note 1, the memory unit is configured to store an identifier for identifying the dummy substrate carrier in association with the film thickness of the dummy substrate when the dummy substrate carrier is unloaded from the substrate receiving unit.

[Supplementary Note 3]

Also, preferably, the substrate processing apparatus according to Supplementary Note 1 further includes:

a maintenance information output unit configured to output maintenance information about the dummy substrate carrier placed on the substrate receiving unit, wherein the maintenance information includes an accumulated film thickness representing a thickness of a film accumulated on the dummy substrate in the dummy substrate carrier; and a first setup unit configured to edit the accumulated film thickness included in the maintenance information outputted by the maintenance information output unit, wherein the management unit updates a film thickness of the dummy substrate in the dummy substrate carrier based on the accumulated film thickness edited by the first setup unit when the dummy substrate carrier is reloaded onto the substrate receiving unit.

[Supplementary Note 4]

Also, preferably, the substrate processing apparatus according to Supplementary Note 1 further includes:

an information output unit configured to output a table of information about the dummy substrate in the dummy substrate carrier placed on the substrate receiving unit, wherein the table includes an accumulated film thickness of the dummy substrate; and a second setup unit configured to edit the accumulated film thickness of the dummy substrate, wherein the management unit updates a film thickness of the dummy substrate in the dummy substrate carrier based on the accumulated film thickness edited by the second setup unit when the dummy substrate carrier is reloaded onto the substrate receiving unit.

[Supplementary Note 5]

Also, preferably, the substrate processing apparatus in any one of Supplementary Notes 1 through 4 is connected to a management apparatus configured to manage the substrate processing apparatus, and is configured to receive from the management apparatus a carrier authentication message having an additional data about the accumulated film thickness of the dummy substrate added thereto.

[Supplementary Note 6]

Also, preferably, in the substrate processing apparatus according to Supplementary Note 5, the management unit updates the film thickness of the dummy substrate in the dummy substrate carrier based on the accumulated film thickness included in the additional data when the carrier authentication message is received.

[Supplementary Note 7]

According to another embodiment of the present invention, there is provided a maintenance method used in a substrate processing apparatus including a process chamber in which a predetermined number of various substrates are processed and a substrate receiving unit on which a dummy substrate carrier in which a dummy substrate that is a type of the various substrates is accommodated is placed, the maintenance method including:

a process of unloading the dummy substrate carrier from the substrate receiving unit in order to perform a regular maintenance operation on the substrate processing apparatus;

a process of previously storing a film thickness of an accumulation film formed on each dummy substrate accommodated in the dummy substrate carrier when the dummy substrate carrier is unloaded from the substrate receiving unit;

a process of reloading the dummy substrate carrier onto the substrate receiving unit;

a process of updating a film thickness of each dummy substrate in the dummy substrate carrier based on the stored film thickness when the dummy substrate carrier is reloaded onto the substrate receiving unit; and a process of performing a process using each dummy substrate after the regular maintenance operation according to the updated film thickness.

[Supplementary Note 8]

According to another embodiment of the present invention, there is provided a maintenance method used in a substrate processing apparatus including a process chamber in which a predetermined number of various substrates are collectively processed and a substrate receiving unit on which a dummy substrate carrier in which a dummy substrate that is a type of the various substrates is accommodated is placed, the maintenance method including:

a process of loading onto the substrate receiving unit a dummy substrate carrier in which a dummy substrate used by another apparatus is accommodated;

a process of obtaining information about a film thickness of an accumulation film formed on each dummy substrate accommodated in the dummy substrate carrier loaded on the substrate receiving unit;

a process of updating a film thickness of each dummy substrate in the dummy substrate carrier on the substrate receiving unit based on the information; and a process of performing a process using each dummy substrate in the dummy substrate carrier after the dummy substrate carrier is loaded onto the substrate receiving unit according to the updated film thickness.

[Supplementary Note 9]

According to another embodiment of the present invention, there is provided a maintenance method used in a substrate processing apparatus including a process chamber in which a predetermined number of various substrates are collectively processed and a substrate receiving unit on which a dummy substrate carrier in which a dummy substrate that is a type of the various substrates is accommodated is placed, the maintenance method including:

a process of unloading from the substrate receiving unit the dummy substrate carrier in order to perform a modifying work on the substrate processing apparatus;

a process of previously storing a film thickness of an accumulation film formed on each dummy substrate accommodated in the dummy substrate carrier when the dummy substrate carrier is unloaded from the substrate receiving unit;

a process of reloading the dummy substrate carrier onto the substrate receiving unit;

a process of updating a film thickness of each dummy substrate in the dummy substrate carrier based on the stored film thickness when the dummy substrate carrier is reloaded onto the substrate receiving unit; and a process of performing a process using each dummy substrate after the modifying work according to the updated film thickness.

[Supplementary Note 10]

According to another embodiment of the present invention, there is provided a method of manufacturing a semiconductor apparatus using a substrate processing apparatus including a process chamber in which a predetermined number of various substrates are collectively processed and a substrate receiving unit on which a carrier in which a product substrate that is a type of the various substrates is accommodated and a dummy substrate carrier in which a dummy substrate that is another type of the various substrates is accommodated are placed, the method including:

a process of placing the carrier in which the product substrate is accommodated on the substrate receiving unit;

a process of unloading the dummy substrate carrier in which the dummy substrate is accommodated from the substrate receiving unit before the process of placing starts; and a process of performing a process on the product substrate in the process chamber.

[Supplementary Note 11]

Also, preferably, in the method according to Supplementary Note 10, when a number of the product substrates which are accommodated is equal to or less than 10, the dummy substrate carrier is reloaded.

[Supplementary Note 12]

According to another embodiment of the present invention, there is provided a maintenance method used in a substrate processing apparatus including a process chamber in which a predetermined number of various substrates are collectively processed and a substrate receiving unit on which a carrier in which a product substrate that is a type of the various substrates is accommodated and a dummy substrate carrier in which a dummy substrate that is another type of the various substrates is accommodated are placed, the maintenance method including:

a process of placing the carrier in which the product substrate is accommodated on the substrate receiving unit;

a process of performing a process on the product substrate unloaded from the carrier on the substrate receiving unit in the process chamber;

a process of unloading from the substrate receiving unit the dummy substrate carrier in which the dummy substrate is accommodated before the process of placing starts;

a process of previously storing a film thickness of an accumulation film formed on each dummy substrate accommodated in the dummy substrate carrier when the dummy substrate carrier is unloaded from the substrate receiving unit;

a process of reloading the dummy substrate carrier onto the substrate receiving unit after the process of performing the process;

a process of updating a film thickness of each dummy substrate in the dummy substrate carrier based on the stored film thickness when the dummy substrate carrier is reloaded onto the substrate receiving unit; and a process of performing a process using each dummy substrate after the dummy substrate carrier is reloaded according to the updated film thickness.

[Supplementary Note 13]

According to another embodiment of the present invention, there is provided a program that causes a computer used by being connected to a substrate processing apparatus including a process chamber in which a predetermined number of various substrates are collectively processed and a substrate receiving unit on which a dummy substrate carrier in which a dummy substrate that is a type of the various substrates is accommodated is placed to perform:

a step of storing in a memory unit a film thickness of each dummy substrate in the dummy substrate carrier when the dummy substrate carrier is unloaded from the substrate receiving unit; and a step of updating the film thickness of each dummy substrate in the dummy substrate carrier based on the film thickness stored in the memory unit when the dummy substrate carrier is reloaded onto the substrate receiving unit.

[Supplementary Note 14]

According to another embodiment of the present invention, there is provided a non-transitory computer-readable recording medium storing a program that causes a computer connected to a substrate processing apparatus including a process chamber wherein a plurality of substrates including a dummy substrate are simultaneously processed and a substrate receiving unit whereon a dummy substrate carrier accommodating the dummy substrate is placed to perform: (a) a step of storing in a memory unit a film thickness of the dummy substrate in the dummy substrate carrier when the dummy substrate carrier is unloaded from the substrate receiving unit; and (b) a step of updating the film thickness of the dummy substrate in the dummy substrate carrier based on the film thickness stored in the memory unit when the dummy substrate carrier is reloaded onto the substrate receiving unit.

What is claimed is:

1. A substrate processing apparatus comprising:
a process chamber where a plurality of substrates including a dummy substrate are processed;
a loading port where a plurality of dummy substrate carriers comprising a first dummy substrate carrier and a second dummy substrate carrier accommodating at least the dummy substrate are placed before the dummy substrate enters the process chamber;
a dummy substrate carrier control unit configured to store, in a memory unit, identifiers for identifying the plurality of dummy substrate carriers and a film thickness of the dummy substrate accommodated in the dummy substrate carrier;
a management unit configured to update the film thickness of the dummy substrate included in a substrate data with the film thickness stored in the memory unit; and
a controller configured to perform a processing using the dummy substrate in the process chamber,
wherein the dummy substrate carrier control unit is further configured to: (i) store, in the memory unit, an accumulated film thickness of the dummy substrate accommodated in the first dummy substrate carrier when the first dummy substrate carrier is unloaded from the loading port; and (ii) identify one of the plurality of dummy substrate carriers using the identifiers stored in the memory unit when the one of the plurality of dummy substrate carriers is loaded on the loading port,
wherein the management unit is further configured to: (i) perform an update process of the film thickness of the dummy substrate by updating the film thickness of the dummy substrate so that the film thickness of the reloaded dummy substrate in the first dummy substrate carrier is equal to the accumulated film thickness of the dummy substrate accommodated in the first dummy substrate carrier unloaded from the loading port when the one of the plurality of dummy substrate carriers is identified as the first dummy substrate carrier; and (ii) suspend the update process when the one of the plurality of dummy substrate carriers is identified as the second dummy substrate carrier, and
wherein the controller is further configured to perform the processing using the dummy substrate in the process chamber when the one of the plurality of dummy substrate carriers is identified as the first dummy substrate carrier.

2. The substrate processing apparatus of claim 1, wherein the memory unit is configured to store an identifier of the identifiers for identifying the dummy substrate carrier in association with the film thickness of the dummy substrate when the dummy substrate carrier is unloaded through the loading port.

3. The substrate processing apparatus of claim 1, further comprising:
a maintenance information output unit configured to output maintenance information about the dummy substrate carrier placed on the loading port, wherein the maintenance information comprises the accumulated film thickness representing a thickness of a film accumulated on the dummy substrate in the dummy substrate carrier; and
a first setup unit configured to edit the accumulated film thickness included in the maintenance information outputted by the maintenance information output unit,
wherein the management unit updates a film thickness of the dummy substrate in the dummy substrate carrier based on the accumulated film thickness edited by the first setup unit when the dummy substrate carrier is reloaded through the loading port.

4. The substrate processing apparatus of claim 1, further comprising:
an information output unit configured to output a table of information about the dummy substrate in the dummy substrate carrier placed on the loading port, wherein the table comprises an accumulated film thickness of the dummy substrate; and
a second setup unit configured to edit the accumulated film thickness of the dummy substrate,
wherein the management unit updates a film thickness of the dummy substrate in the dummy substrate carrier based on the accumulated film thickness edited by the second setup unit when the dummy substrate carrier is reloaded through the loading port.

5. The substrate processing apparatus of claim 1, wherein the substrate processing apparatus is connected to a management apparatus configured to manage the substrate processing apparatus, and is configured to receive from the management apparatus a carrier authentication message having an additional data about the accumulated film thickness of the dummy substrate added thereto.

6. The substrate processing apparatus of claim 5, wherein the dummy substrate carrier control unit is further configured to determine whether to reset the accumulated film thickness of the dummy substrate according to a flag attached to the carrier authentication message.

7. The substrate processing apparatus of claim 1, wherein the substrate processing apparatus is connected to a management apparatus configured to manage the substrate processing apparatus, and is configured to receive from the management apparatus a carrier authentication message having an additional data about the accumulated film thickness of the dummy substrate added thereto,
wherein the management unit updates the film thickness of the dummy substrate in the dummy substrate carrier based on the accumulated film thickness included in the additional data when the carrier authentication message is received.

8. The substrate processing apparatus of claim 1, wherein the one of the plurality of dummy substrate carriers accommodates a dummy substrate used in another substrate processing apparatus.

9. The substrate processing apparatus of claim 1, further comprising a display unit configured to display information on each dummy substrate corresponding to a slot number in the dummy substrate carrier.

* * * * *